United States Patent [19]

Linnenbrink et al.

[11] 4,340,874
[45] Jul. 20, 1982

[54] TRANSIENT DATA RECORDER SYSTEMS

[75] Inventors: Thomas E. Linnenbrink, Winnetka; David A. Gradl, Des Plaines, both of Ill.

[73] Assignee: Q-Dot, Inc., Des Plaines, Ill.

[21] Appl. No.: 44,078

[22] Filed: May 31, 1979

[51] Int. Cl.³ .................. H01P 9/00; G11C 19/28; H01L 29/78; H03H 15/02
[52] U.S. Cl. .................. 333/165; 307/221 D; 333/160; 333/166; 357/24
[58] Field of Search ............... 333/165, 166, 160, 156, 333/161, 245–246; 357/24; 307/221 R, 221 C, 221 D

[56] References Cited

U.S. PATENT DOCUMENTS

| | | | |
|---|---|---|---|
| 2,980,871 | 4/1961 | Cox | 333/166 X |
| 3,768,046 | 10/1973 | Lorber et al. | 333/160 |
| 3,801,883 | 4/1974 | Tiemann | 357/24 X |
| 4,028,715 | 6/1977 | Emmons | 357/24 |
| 4,032,867 | 6/1977 | Engeler et al. | 333/165 |
| 4,161,706 | 7/1979 | Dubil et al. | 333/165 X |

OTHER PUBLICATIONS

"Assessment of CCD's for Transient Data Recording" Q.Dot, Inc., Northfield, Ill., Sep. 1977.
"CCD and Exerciser Preliminary Design Report" Q.Dot, Inc., Northfield, Ill., May 1978.

Primary Examiner—Marvin L. Nussbaum
Attorney, Agent, or Firm—Fitch, Even, Tabin, Flannery & Wels

[57] ABSTRACT

Transient data recorder systems including a high speed charge coupled device and a device exerciser, including a high speed sampler and driver circuitry.

2 Claims, 22 Drawing Figures

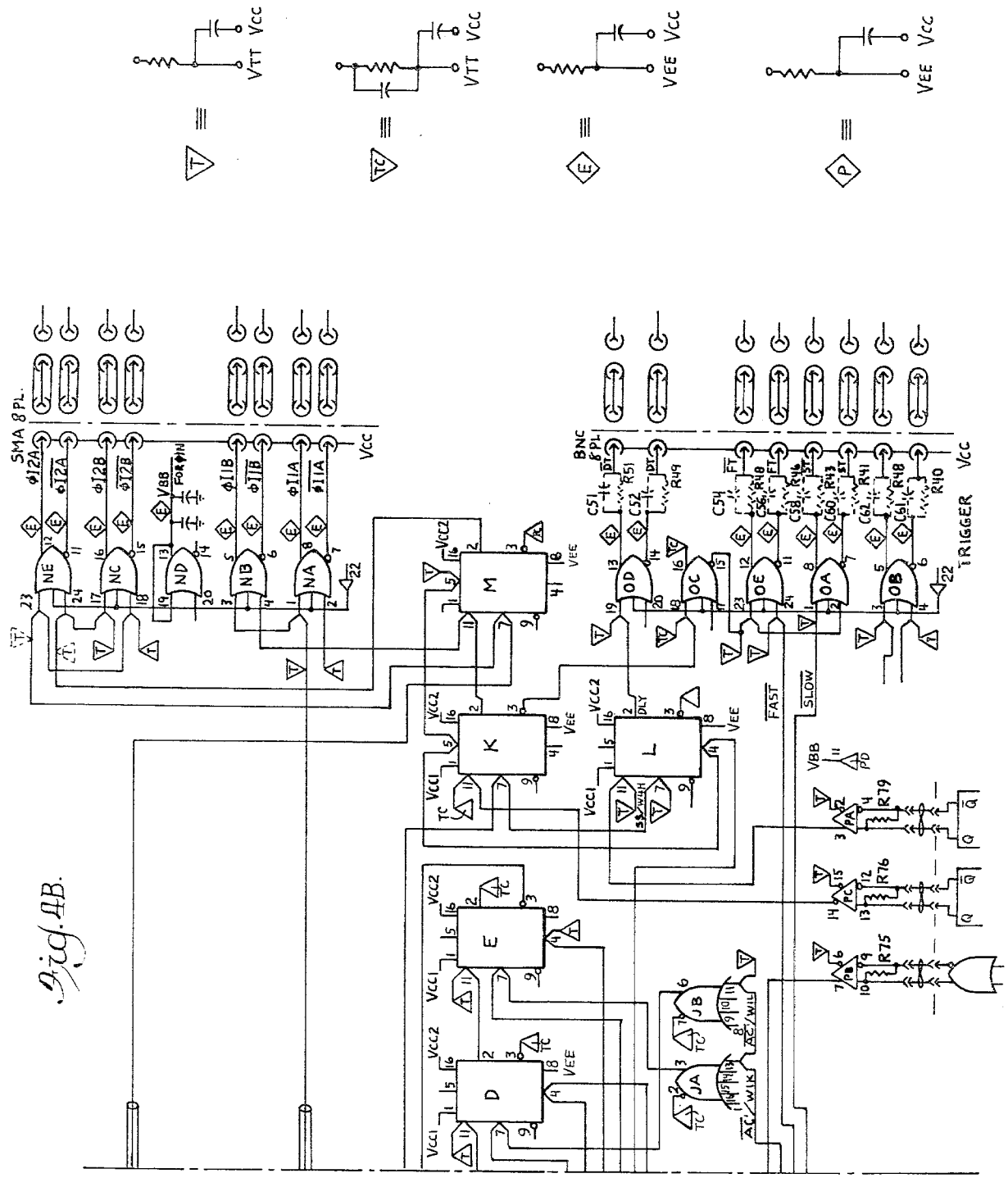

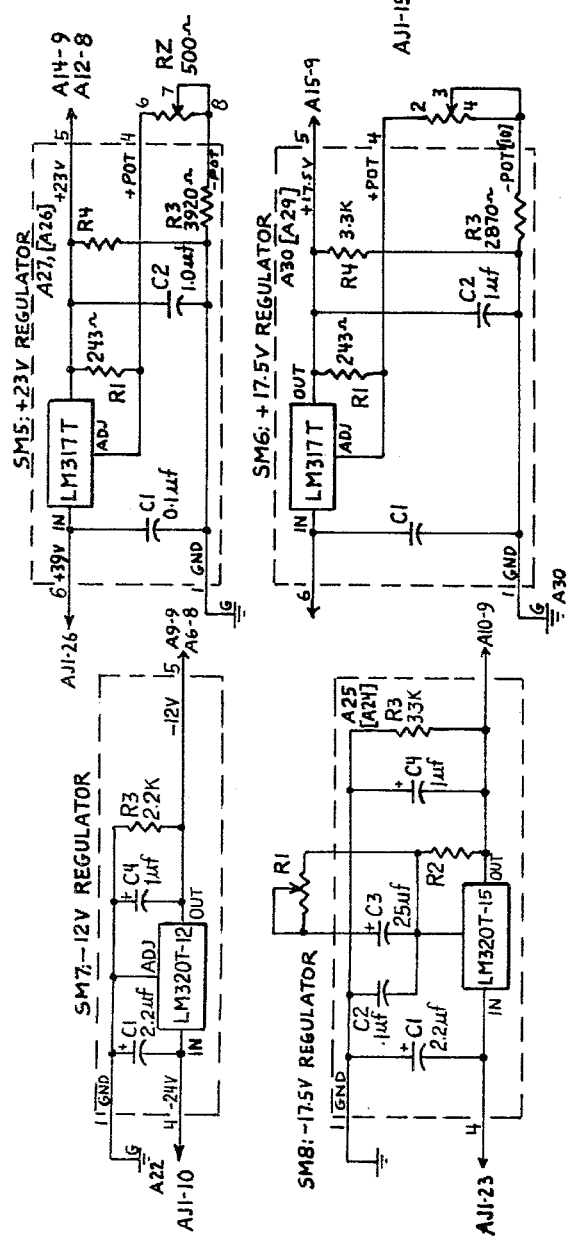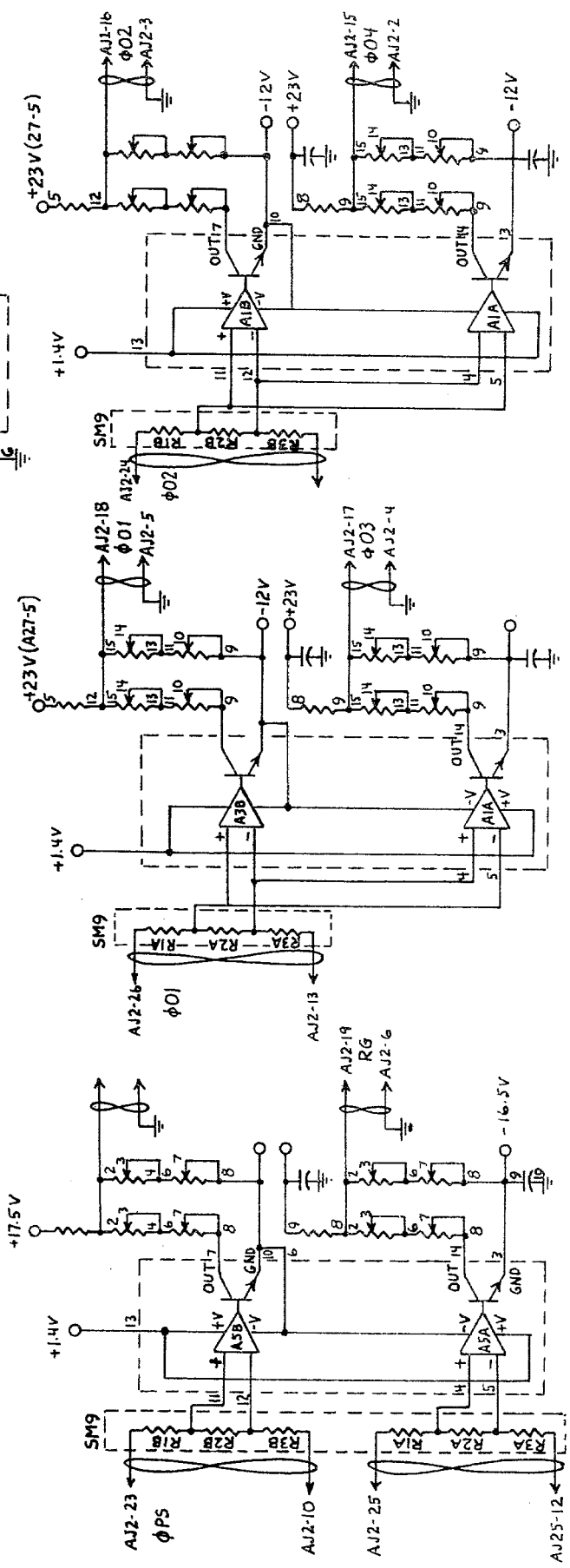
Fig. 6.

EXERCISER TIMING

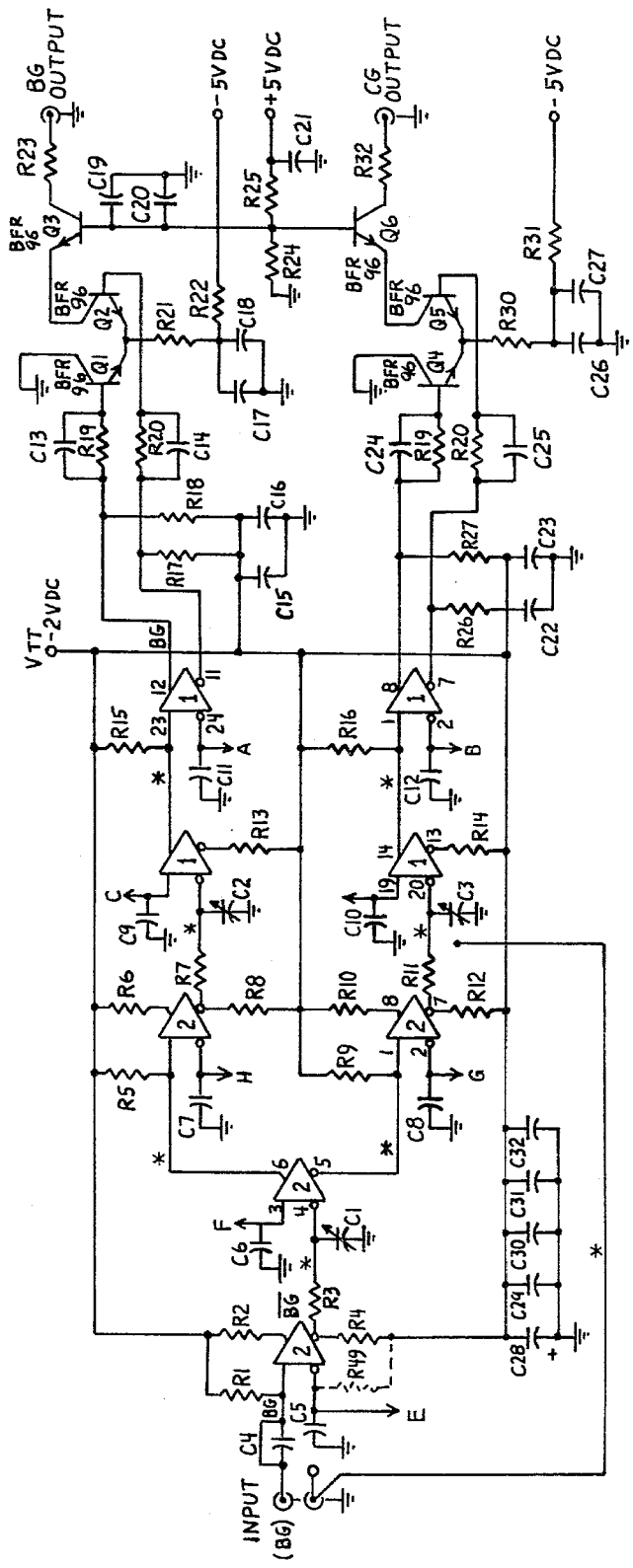
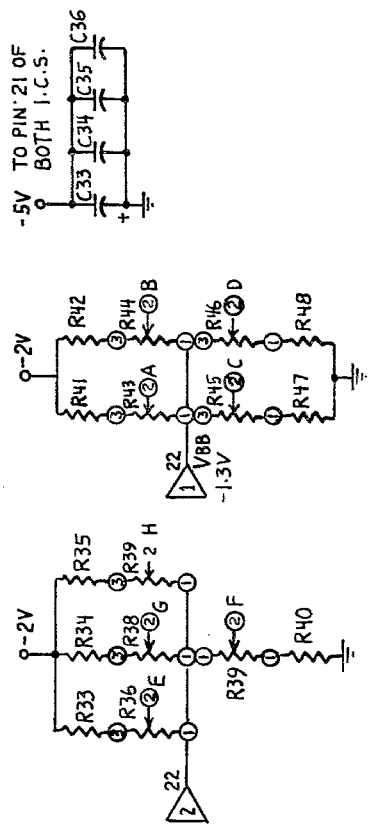
Fig. 11.

TEST CIRCUIT:

250 MHZ    2ns/DIVISION

200 MHZ    2ns/DIVISION

100 MHZ    5ns/DIVISION

10 MHZ    50ns/DIVISION

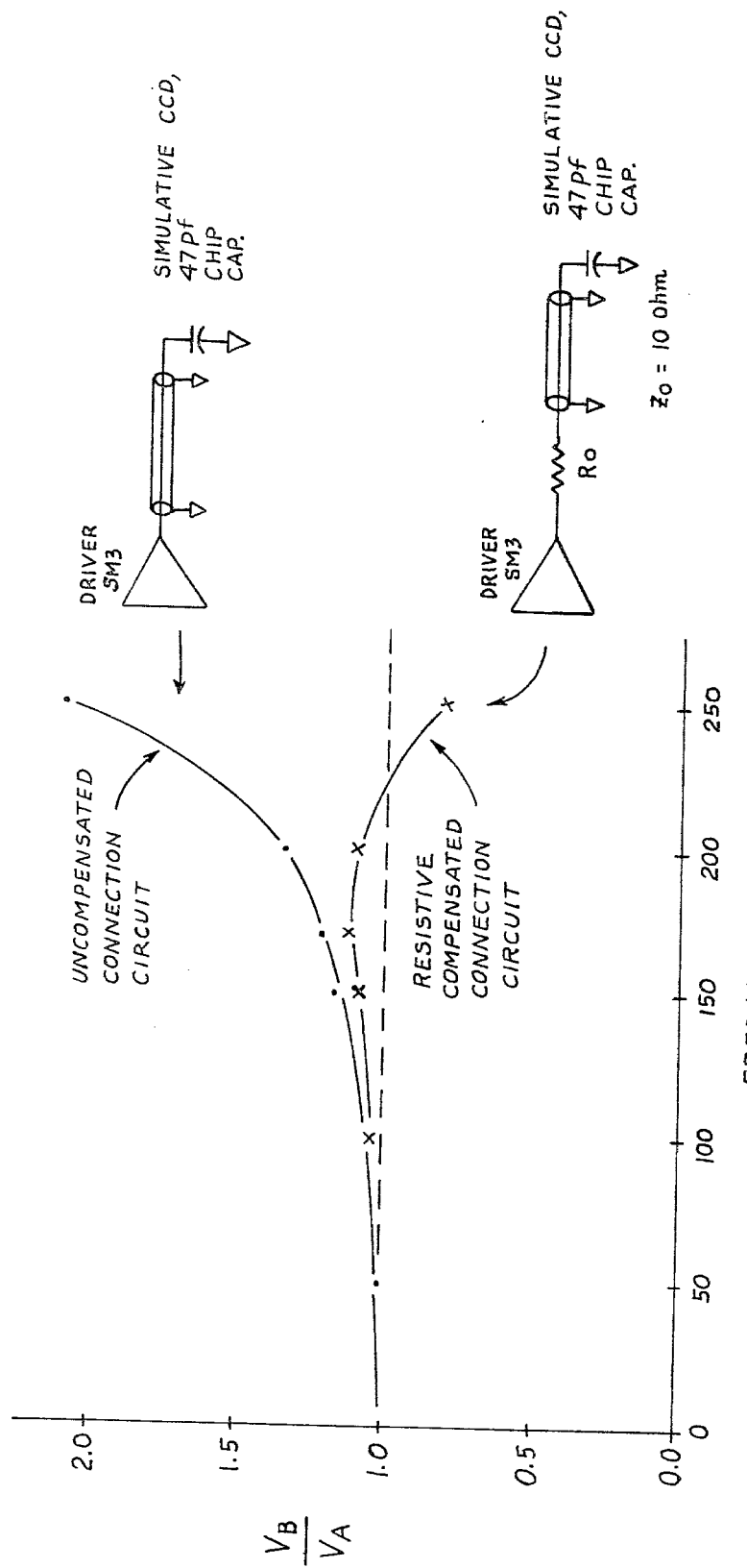
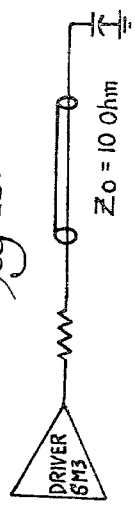
Fig. 15.
Fig. 16. MEASURED STEADY-STATE VOLTAGE RATIO OF CONNECTION CIRCUITS

TRANSIENT DATA RECORDER SYSTEMS

The Government of the United States of America has rights in this invention pursuant to LANL Subcontract 4-X40-8499L-1, awarded by the United States Department of Energy, or confirmatory license from Q-Dot, Inc.

The present invention is directed to methods and apparatus for transient data recording, and more particularly, is directed to such methods and apparatus utilizing high speed charge coupled device systems.

The recording of bandwidth transient data by computer-compatible instruments has presented a significant challenge to instrumentation developers. Transient data (i.e., any high-bandwidth data in a low-bandwidth background has been recorded with cameras mounted on oscilloscopes. The resulting photographs are then digitized with manual or semi-automatic equipment. A variation of the traditional oscilloscope, the scan converter, replaced the scope face with an electronically read storage matrix.

A conventional direct digital transient recorder are also known in which filtered, continuous analog data is sampled, digitized, and stored digitally in real-time.

Transient data recorders have also used high speed charge-coupled devices (CCD) to provide a dual-speed analog buffer. Full-rate, sampled analog data (i.e., discrete-in-time, continuous-in-amplitude data) are shifted into the CCD in a charge-equivalent-to-signal form at the full sampling rate, typically five times the bandwidth. Data are continuously shifted in until a trigger stops the process. The trigger can occur before, during or after the event of interest. Once the event is captured, the data may be shifted out of the CCD at a slower rate [Y. J. Chan, et al., "Extremely High Speed CCD Analog Delay Line", Proceedings of 1975 International Conference on the Application of Charge-Coupled Devices, San Diego, California, Oct. 29-31, 1975, pp. 389-398; D. A. Gradl, et al., "High Speed Operation of CCDs", ibid., pp. 399-412; T. E. Linnenbrink, et al., "A CCD-Based Transient Data Recorder", ibid., pp. 443-453; and J. W. Balch, et al., "A CCD Integrated Circuit for Transient Data Recorders", Proceedings of Conference on Charge-Coupled Device Technology and Applications, Washington, D.C., Nov. 30-Dec. 2, 1976, pp. 115-119]. However, such conventional transient data recording systems have undesirable performance limitations, particularly in respect of operation at very high frequencies such as sampling frequencies greater than 100 MHz.

In this connection, there is a need for signal sampling systems and CCD transport driving systems which operate at very high frequencies, and the development of such systems has presented substantial difficulty in the art. For example, charge transport drivers which are capable of driving the relatively high capacitance load (e.g., 40 picofarads) of CCD transport electrodes over a broad range of frequencies (e.g., DC to 200 MHz) at relatively high voltage swings, while retaining the capability of stopping charge transport without sampled signal loss, are not conventionally available.

Accordingly, it is an object of the present invention to provide improved transient data recorder systems which are adapted for high frequency operation. It is a further object to provide methods and apparatus for high speed signal sampling, and for high speed charge transfer operation. These and other objects of the invention will become more apparent from the following detailed description and the accompanying drawings, of which:

Figure 1:
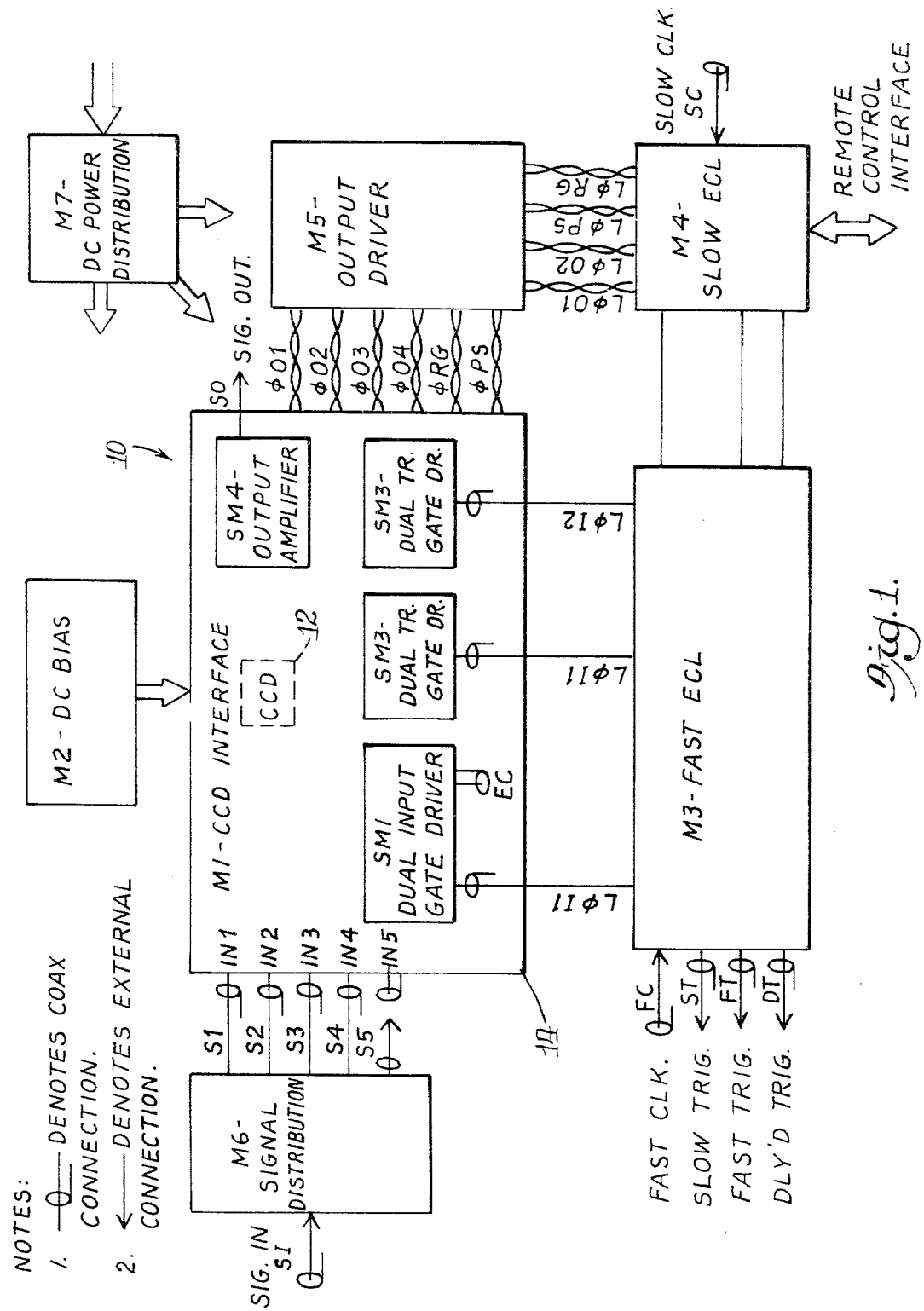
FIG. 1 is a block diagram of a transient data recorder comprising a charge coupled device and an exerciser for the device.
Figure 4A:
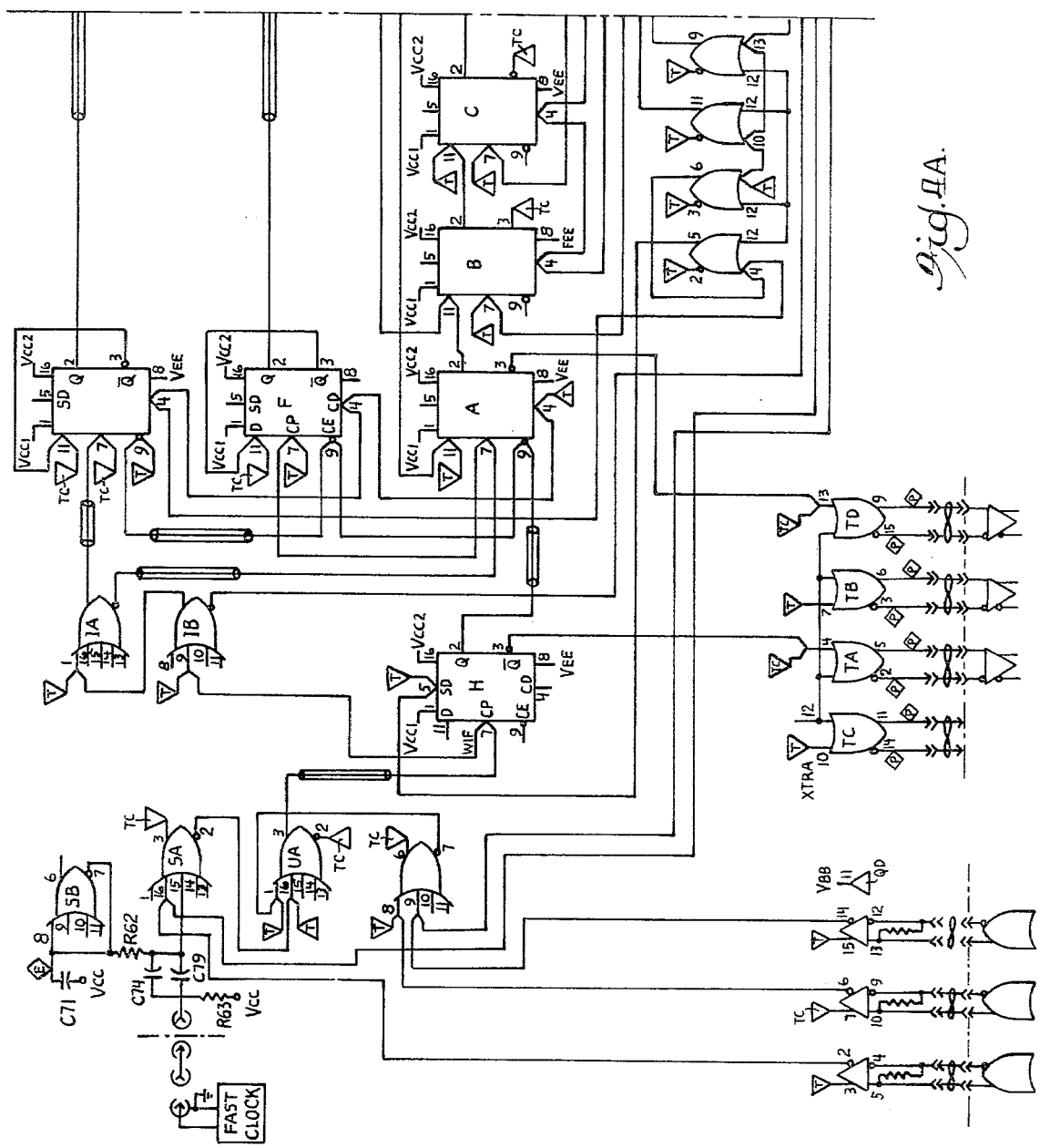
Figure 5A:
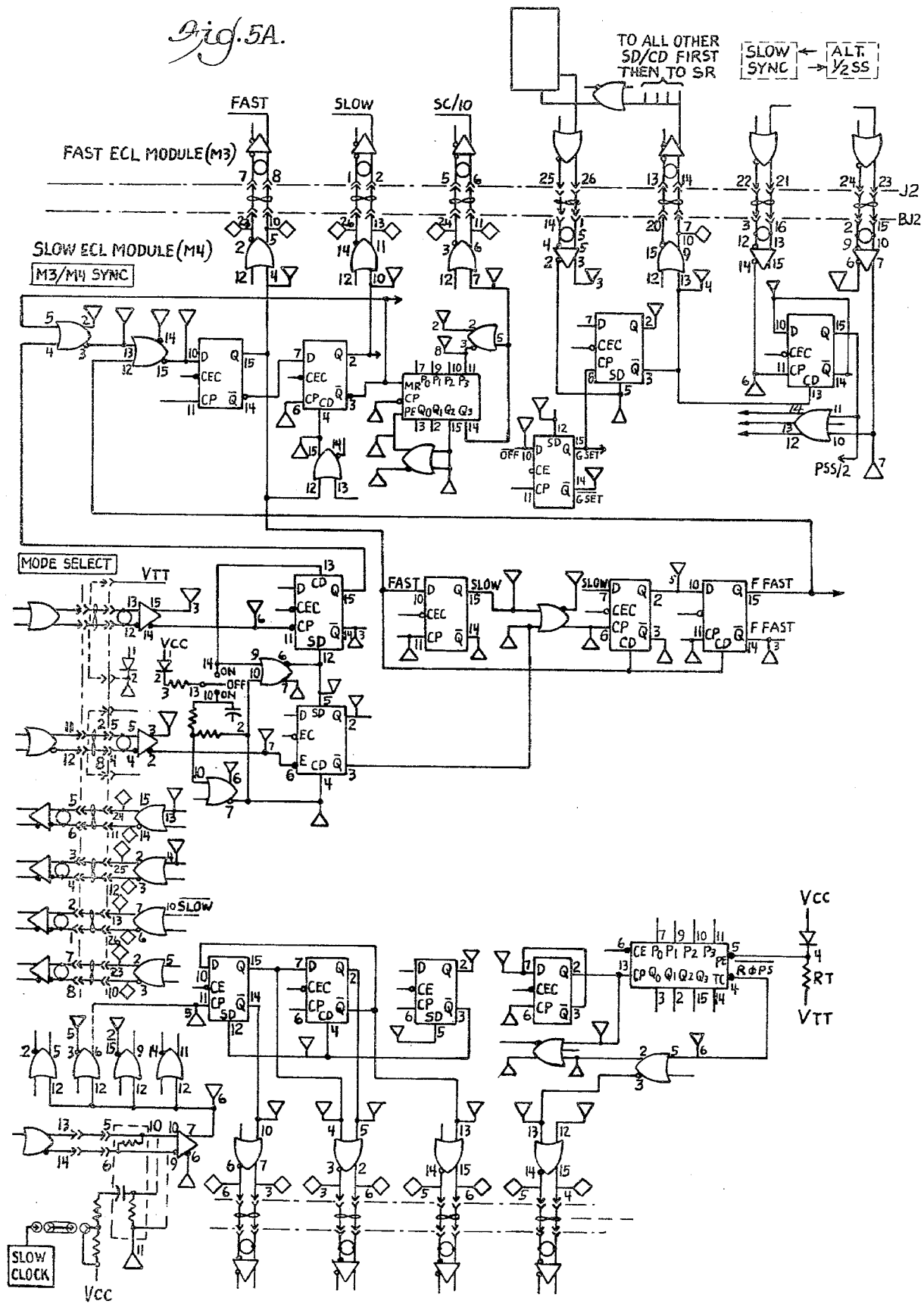
Figure 5B:
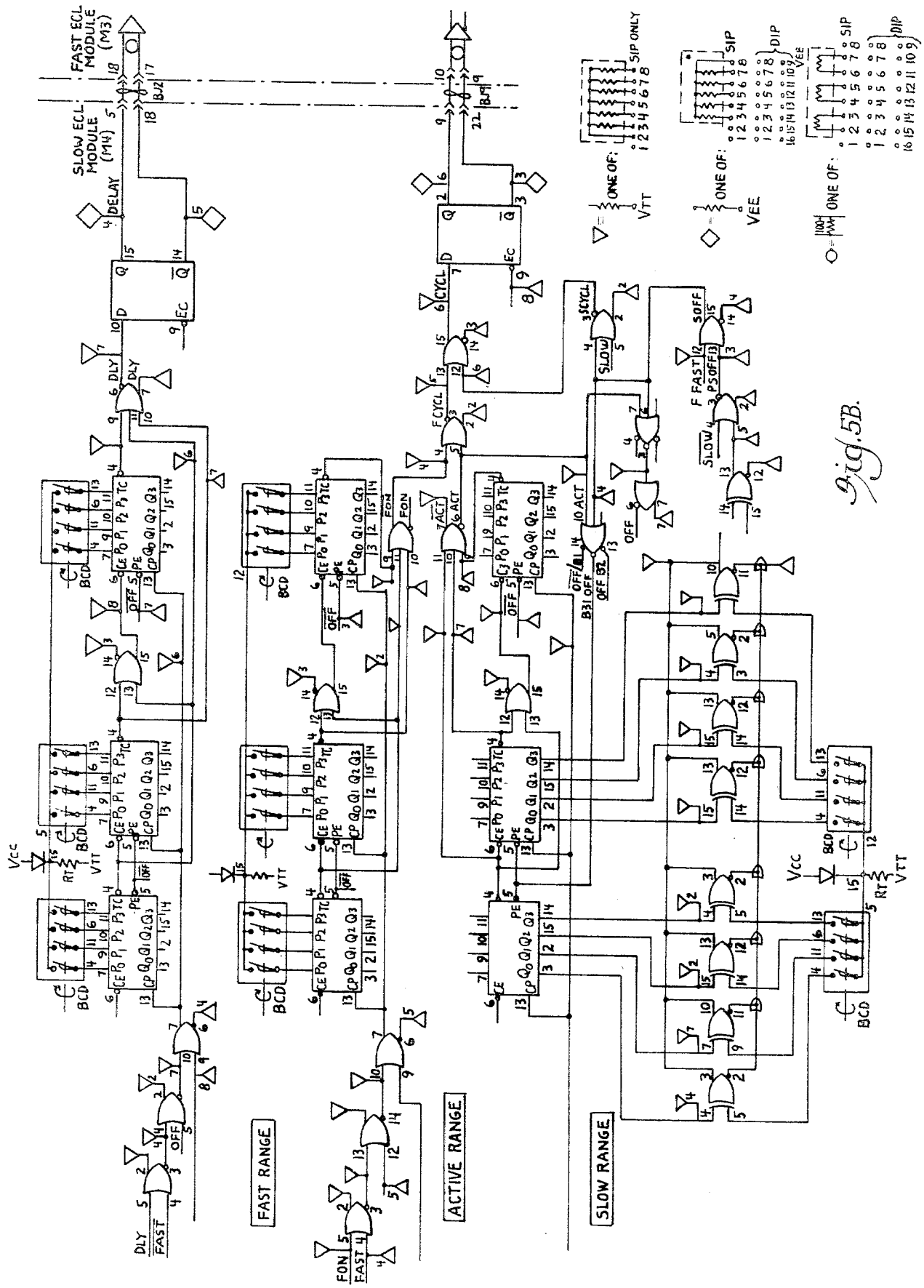
Figure 7:
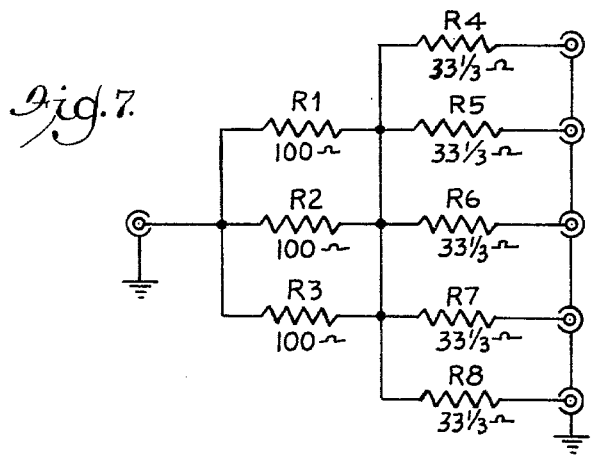
Figure 8:
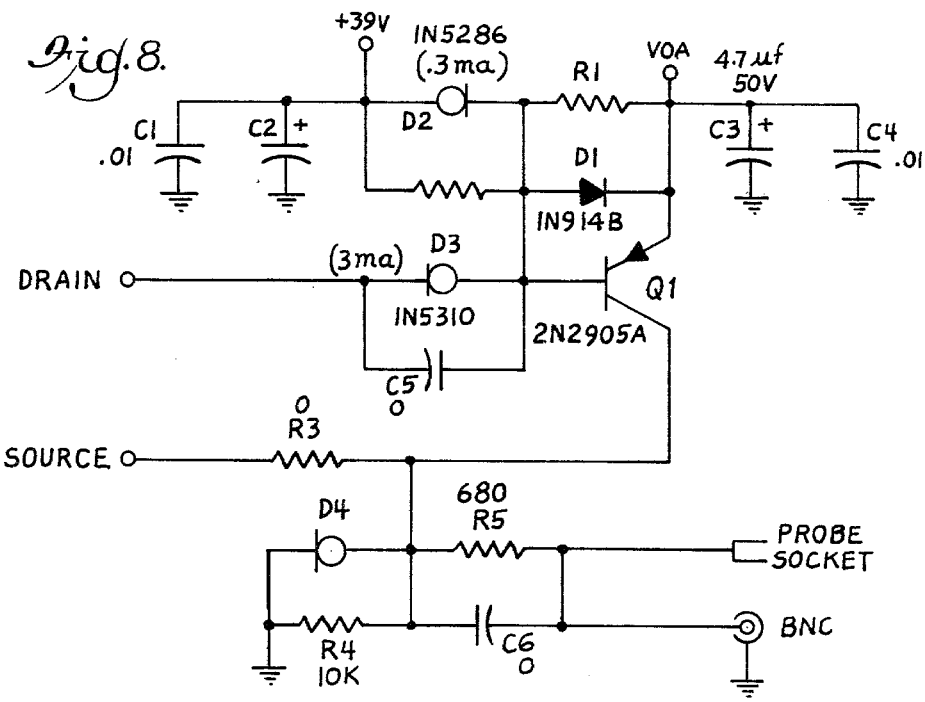
Figure 13:
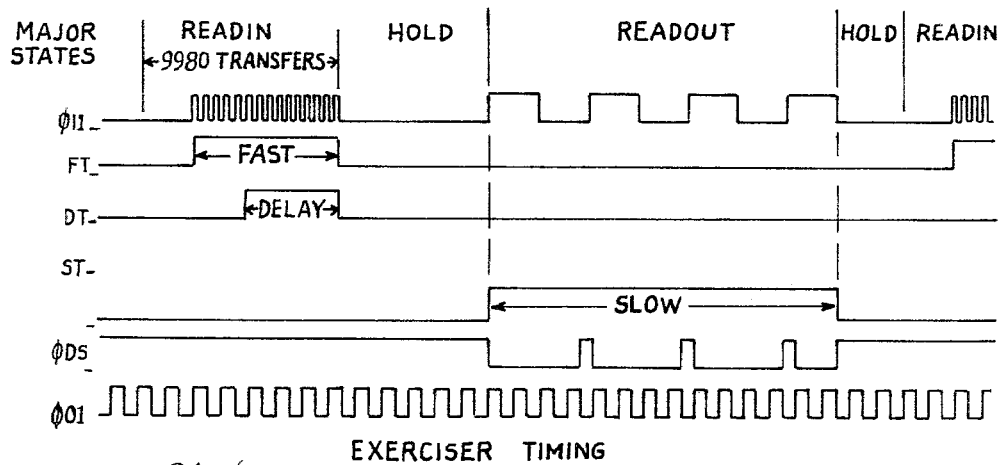
Figure 9:
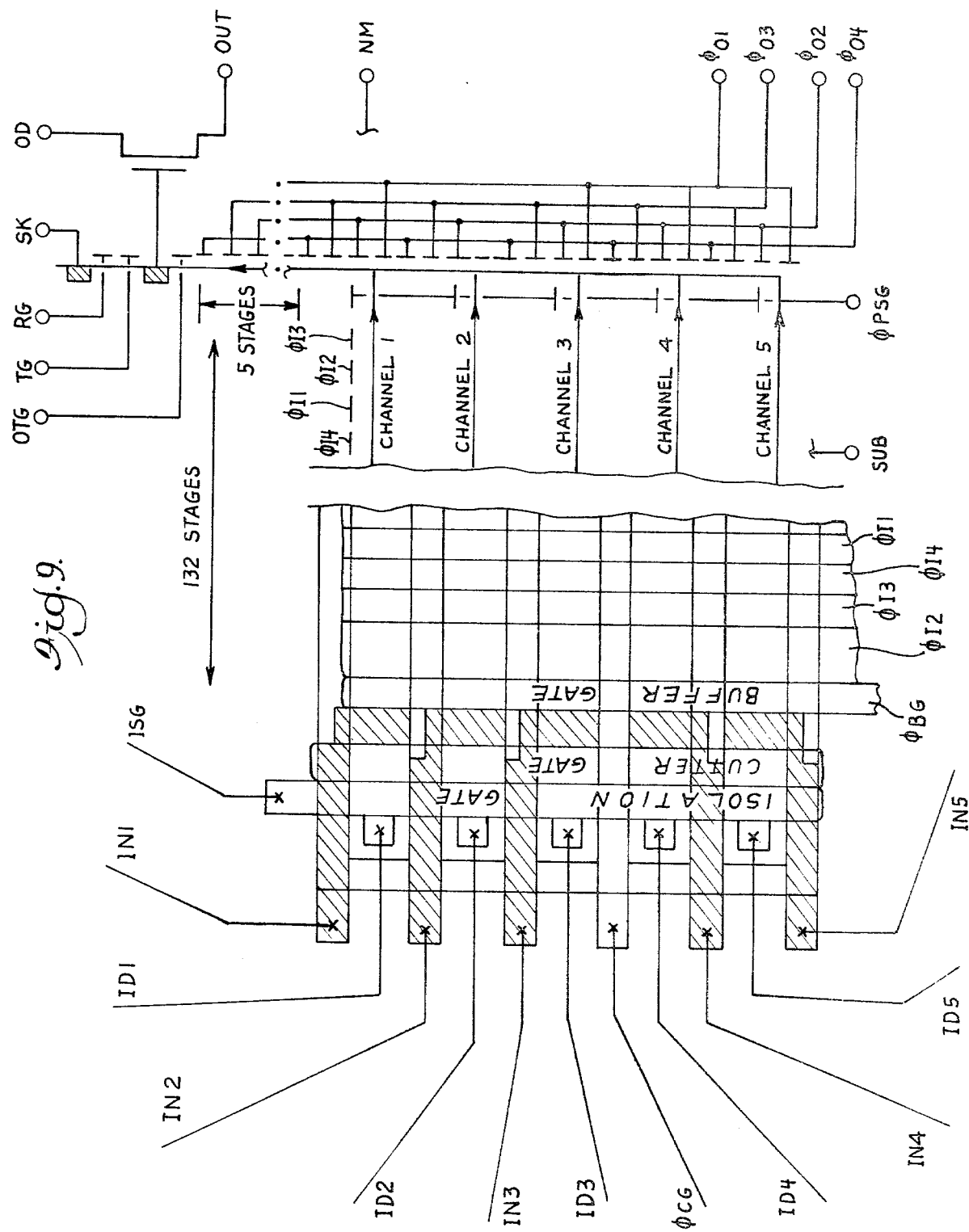
Figure 10:
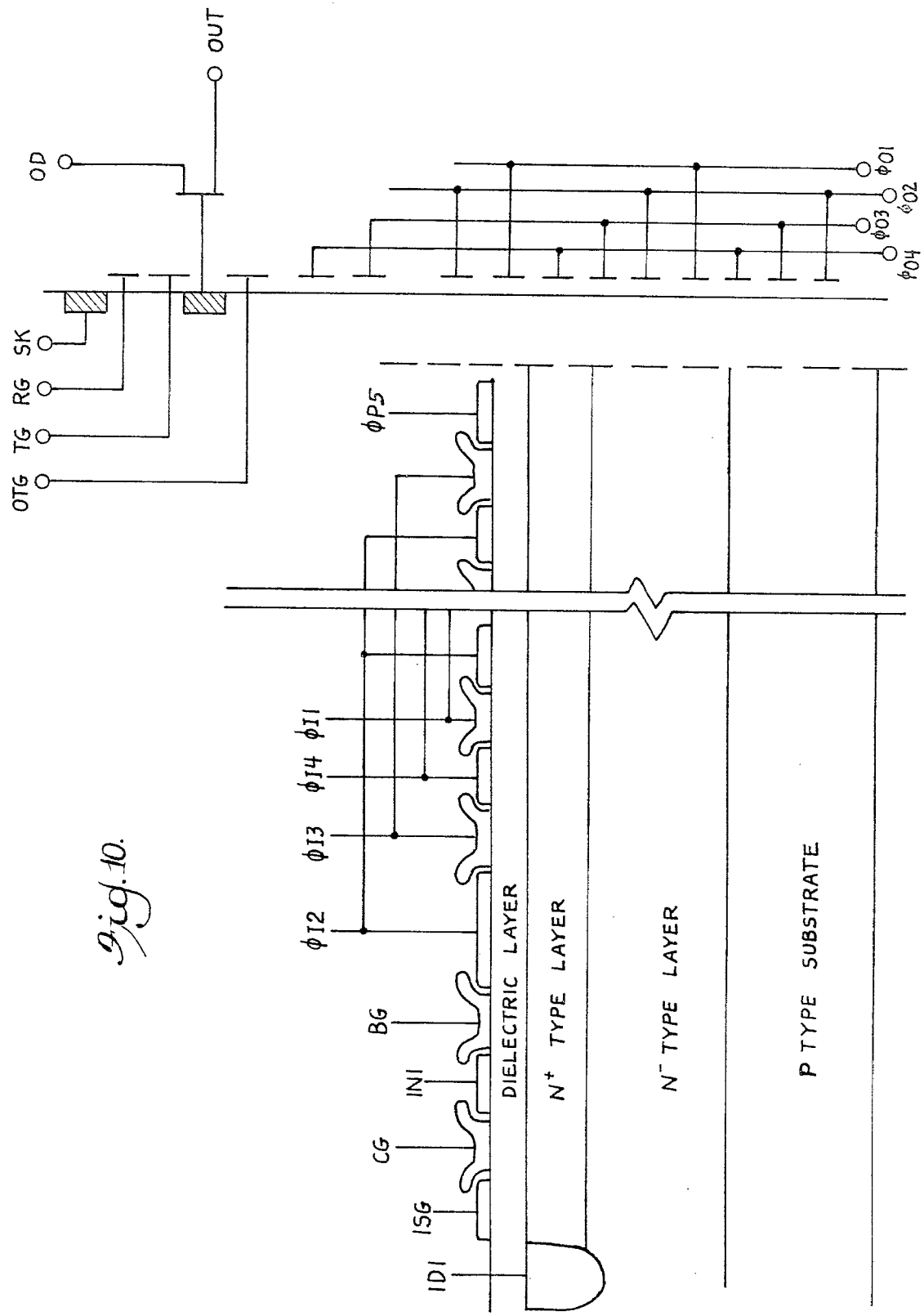
Figure 12:
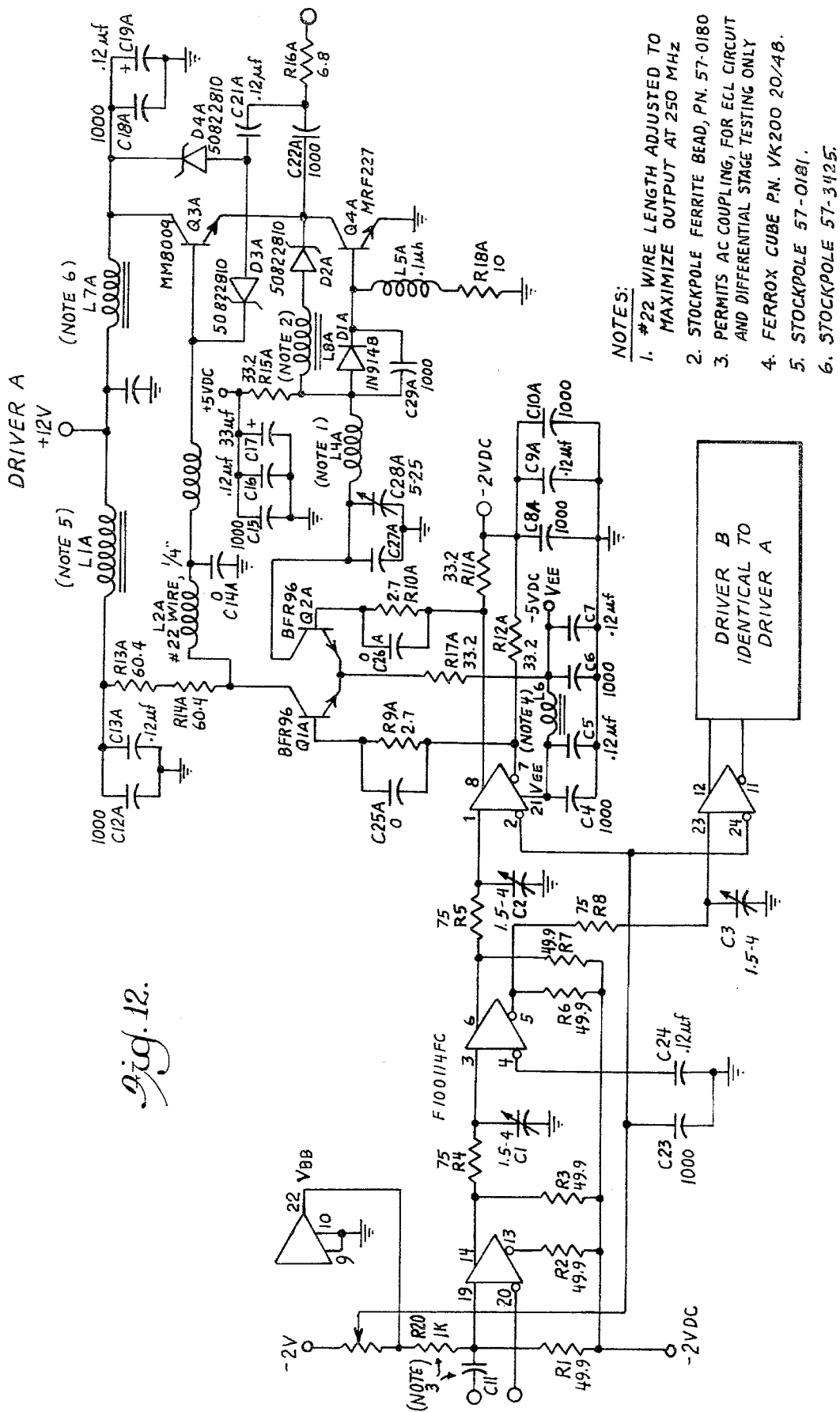
Figure 14:
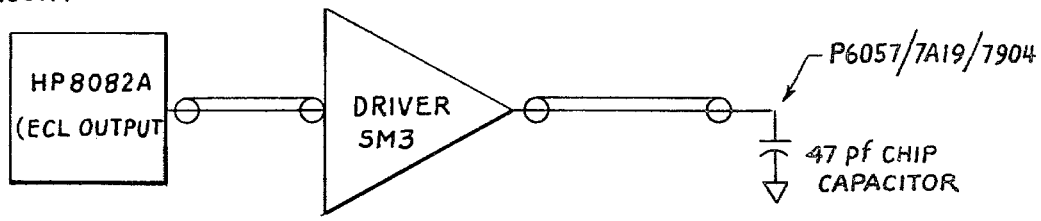
Figure 14A:
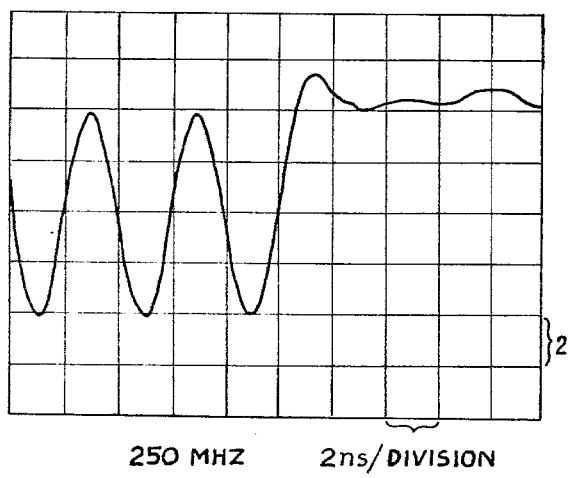
Figure 14B:
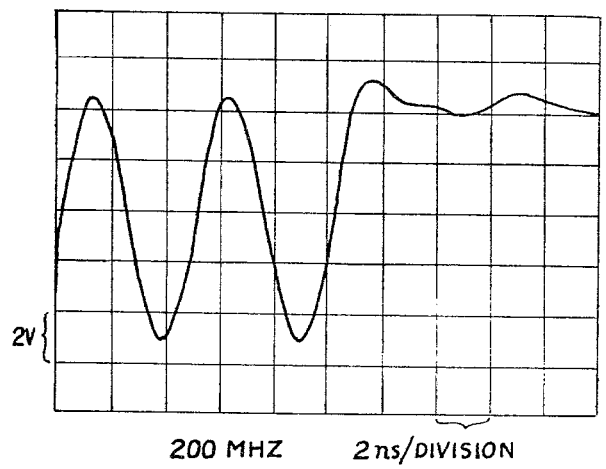
Figure 14C:
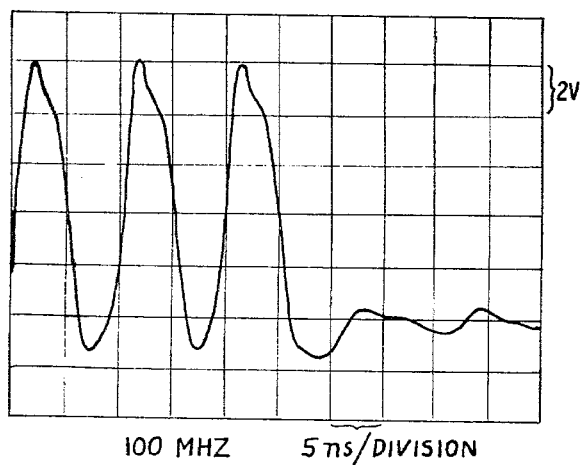
Figure 14D:
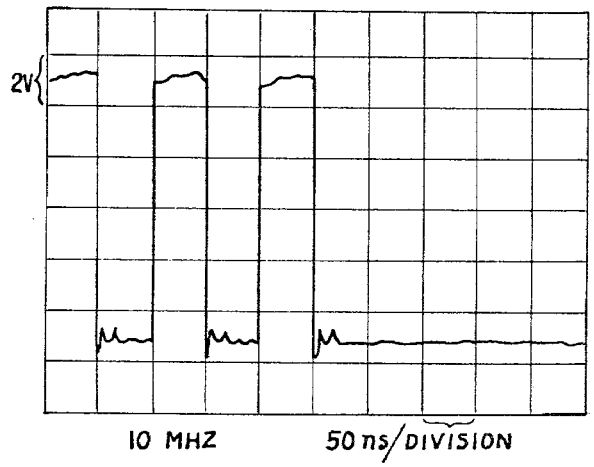

FIGS. 4A and 4B, with the FIGURES being joinable at the top of FIG. 4A and the bottom of FIG. 4B are a circuit schematic of the M3-fast ECL circuitry of the recorder of FIG. 1;

FIG. 5A and 5B are a circuit schematic of the M4-slow ECL circuitry of the recorder of FIG. 1;

FIG. 6 is a circuit schematic of the M5-output driver circuitry of the recorder of FIG. 1;

FIG. 7 is a circuit schematic of the M6 signal distribution circuitry of the recorder of FIG. 1;

FIG. 8 is a circuit schematic of the SM4 output amplifier submodule of the CCD interface module of the recorder of FIG. 1;

FIG. 9 is a top schematic view of the CCD of the recorder of FIG. 1;

FIG. 10 is a cross sectional side view of one channel of the CCD of FIG. 9 with a schematic representation of the multiplexing output channel and output structure;

FIG. 11 is a circuit schematic of the dual input gate driver for the CCD of FIG. 9;

FIG. 12 is a circuit schematic of the high frequency for the transport electrodes of the CCD of FIG. 9;

FIG. 13 is a timing diagram for the recorder of FIG. 1;

FIG. 14 is a test circuit diagram for the SM-3 driver, and FIGS. 14a, 14b, 14c and 14d are reproductions of oscilloscope traces of the output of the driver of FIG. 12 showing its abrupt turn-off capability;

FIG. 15 is a circuit schematic of the coupling circuitry for coupling the drivers of FIG. 12 to the CCD of FIG. 9; and FIG. 16 is a graph of coupling performance for the circuit of FIG. 15.

Generally, the present invention is directed to transient data recording methods and apparatus utilizing high speed charge coupled devices comprising a plurality of channels each including a sampling section and a charge storage and transport section. The methods and apparatus further utilize means for parallel distribution of the sample signal to the respective plurality of sampling means of the CCD, with predetermined signal delay increments, as will be more fully described hereinafter.

The signal sampling means of the charge coupled device may comprise an input diffusion disposed in a buried charge transport channel, and an isolation gate, a cutter gate, a signal gate and a buffer gate structure disposed adjacent such channel. The CCD will further comprise a signal transport and storage section utilizing a multiphase electrode system for signal transport therein of the signal charge packets provided by the sampling means. Suitable means for driving the cutter gate and the buffer gate, and for driving the transport electrode system are also provided.

The buffer gate is independent of electrical connection to the multiphase transport electrode system, and means for driving the buffer gate is provided which produces a duty cycle different from (i.e., larger than)

and with a faster rise time than the duty cycle and rise time of the transport electrode driving means.

The multiphase transport electrode driving means provided herein, in turn, form an important part of the present disclosure. In accordance with the present invention, such driving means are provided which generate multiphase driving signals at a frequency of at least 150 MHz, and preferably at least 200 MHz, and a peak to peak output voltage of at least about 6 volts, and preferably at least about 8 volts to drive a CCD transport electrode capacitive load of at least about 40 picofarads and preferably at least about 50 picofarads. The driving means should also be adapted to immediately stop generating the output signal, within one cycle time period, while substantially continuously maintaining the peak output voltage to maintain charge storage in the transfer channel of the CCD.

The invention will now be more particularly described with respect to the embodiment 10 of a transient data recorder illustrated in FIG. 1 of the drawings. The illustrated recorder 10 comprises a charge coupled device 12. The CCD 12 itself comprises a plurality of individual signal samplers and associated charge transport channels, as shown in FIGS. 9 and 10. The CCD 12 is of buried channel, high speed peristaltic design, utilizing a parallel structure which minimizes the clock and sampling requirements to one each, respectively. A common sampler driver accordingly drives all channels, simultaneously to provide good sampler matching. In order to provide a plurality of (e.g., five) samples per clock cycle, the input signal is split into a corresponding plurality of segments, uniquely delayed to I/n cycle intervals (where n is the number of samples to be taken per cycle and I is a cycle period) and separately brought to the CCD's n input ports. Other configurations are possible, such as accommodating multiple signal inputs at slower sampling rate and shorter record length.

Figure 2:
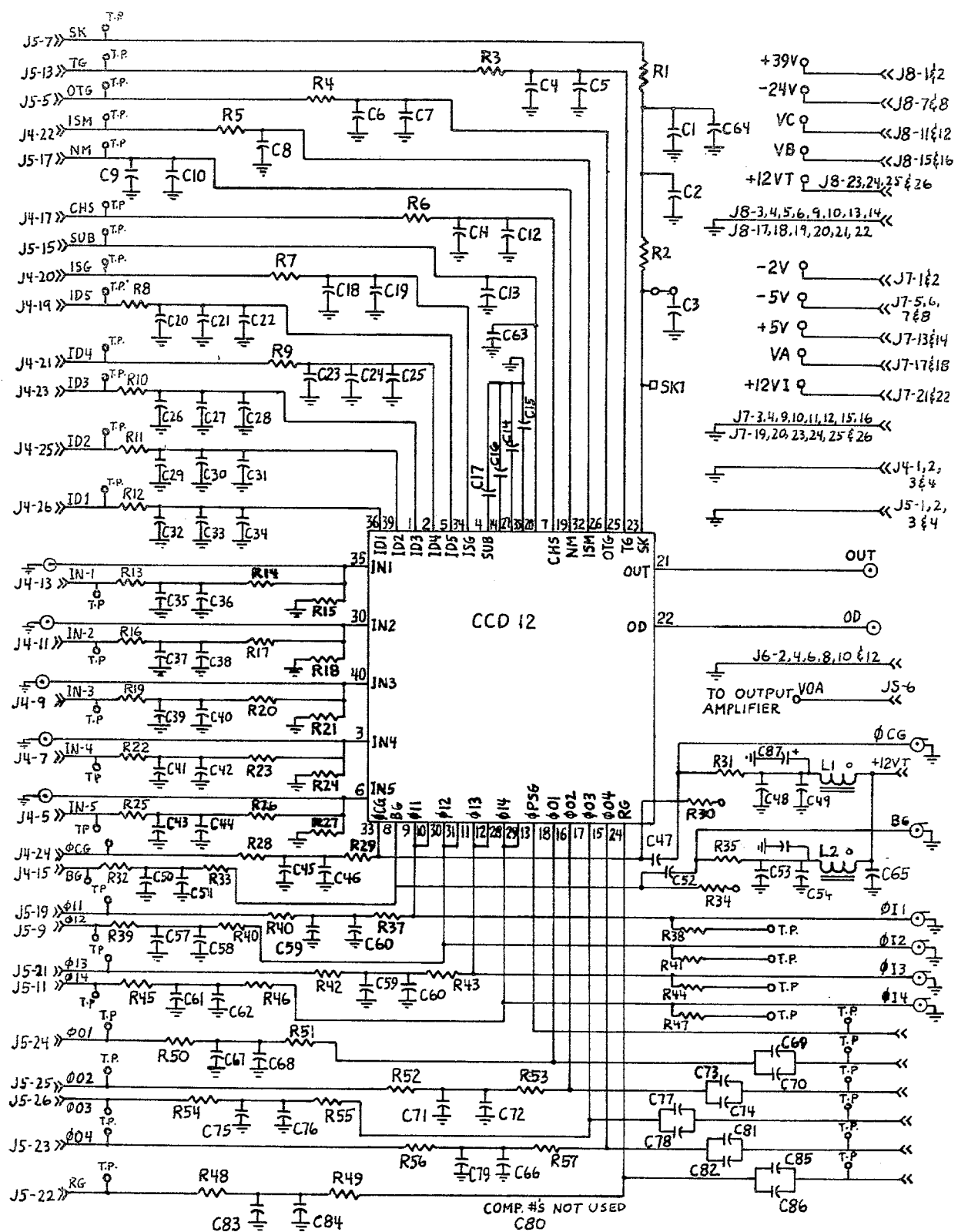
FIG. 2 is a circuit schematic of the M1-CCD interface of the recorder of FIG. 1.

As shown in the illustrations of FIGS. 2, 9 and 10, the pin connections at the CCD interface module M1, and their various functions may be set forth as follows:

IN1-IN5—Input Gates 1-5. The analog signal input gate of the 5 samplers. Signals provided from signal splitting module M6 via appropriate delay cables.

ID1-ID5—Input Diffusion 1-5. The sampler input diffusions are dc biased to provide the source of charge which is quantized by the sampler.

CHS—Channel Stop. Heavily doped diffusion lines which define each CCD channel perimeter and isolate it. The CHS is biased with respect to the substrate in a manner which provides a potential barrier to signal charge in the CCD structure in accordance with conventional practice.

$\phi$BG—Buffer Gate. The first clocked electrode to the right of the sampler signal gate. It isolates the sampler from the rest of the channel during the charge quantizing period. It later provides a potential well to remove charge from under the signal gate, after the charge quantization is completed. (This electrode extends across all 5 signal channels, which are clocked simultaneously)

$\phi$I1-$\phi$I4—The four transport gates of input channels. These electrodes receive four phased, driving waveforms which propagate charge packets received from the sampler, down the input channel to the output multiplexing channel, in a controlled manner. These gates are driven at high speeds when acquiring data, then at low speeds during data readout.

SUB - Substrate. The lower most semiconductor layer of the CCD. Receives a dc bias voltage and serves as a reference electrode when biasing all other electrodes.

$\phi$PSG - Parallel Series Gate. The last transfer gate of the input registers (channels). It is driven with a synchronous waveform which controls charge transfer during data readout, from the 5 input registers into the multiplexing output register.

$\phi$01-$\phi$04

The four transport gates of the output register. The electrodes are driving with synchronized low speed waveforms which control charge transfer along the output register (output register is 10 cells in length) during the data readout mode.

NM—N Mout Diffusion. A heavily doped diffusion ring surrounding the active CCD structure which isolates the active region from external thermally generated charge carriers. It is dc biased.

OUT—Output FET source electrode. Connects to the external portion of the output amplifier circuit.

OD—Output FET drain electrode. Connects to the external portion of the output amplifier circuit.

SK—Output charge sink. The electrode which removes the signal charge from the output structure, after the data has been read out. Receives a dc bias voltage only.

RG—Reset FET Gate electrode. Receives a synchronous waveform which controls signal charge removal from the output diffusion, after data readout.

TG—Tetrode Gate (of Reset FET). Acts to reduce clock noise on the output signal by reducing RG to output diffusion capacitance. It is dc biased "on" at all times.

OTG—Output Transfer Gate. The last gate of the output register. Provides isolation between the final transport gate and the output diffusion. It is dc biased (no AC waveform).

ISM—Isolation MOUT. Same description as NM.

$\phi$CG—Cutter Gate. The sampler gate which permits or blocks charge flow between the ID and IN, thus controlling the charge quantizing process. (This gate extends across all 5 input structures and thus provides simultaneous sampling at all 5 channels.

When the cutter gate potential is positive, such that charge flows freely between IN and ID, the charge existing under IN is determined by the signal voltage applied to IN. When the cutter gate potential is shifted negatively, the charge under IN at that moment is isolated, and then becomes independent of the signal voltage.

ISG—Input isolation gate. The first input channel gate, adjacent to the input diffusions (ID1-5). The gate is dc biased very positively to permit free charge flow under it at all times. (This gate extends across all 5 input channels). It provides isolation between ID and $\phi$CG.

The exerciser 14 is an array of modules which may be housed in a conventional, rack-mountable chassis and which provides all the timing, drive waveforms, biasing and signal interfacing the CCD requires to function as a transient recorder.

The major exerciser modules, and key submodules are diagrammed in FIG. 1. As shown in FIG. 1, CCD interface module M1 is the principle module of the exerciser 14 because it links all signals with the CCD 12. The CCD 12 is mounted on the exerciser 14 by means of a pressure plate (not shown) which applies force to the O-ring to distribute it directly to the CCD leads, forming a pressure contact with mating, gold-plated traces on the M1 circuit board. Chip resistors and capacitors are used close to the CCD to optimize high frequency signal handling. Critical submodules are mounted directly to the CCD interface M1. In this regard, two, dual transport drivers SM3 provide charge propagation in the five parallel input registers of the CCD 12. The transport drivers SM3 provide relatively constant rise and fall times (1.6 ns) and amplitude (10 Vp-p) over their full DC to 250 MHz operating range. They are driven directly from relatively low voltage ECL logic. Similarly, input driver SM1 operates the on-chip signal sampler. It, too, operates from ECL logic provided by ECL logic circuitry of module M3 over a DC-250 MHz range. The off-chip portion of the output amplifier is provided by submodule SM4 of the CCD interface module M1, which, in combination with on-chip circuitry, converts signal in charge-equivalent form to a conventional voltage-equivalent form.

Incoming signal to be recorded is brought to the signal distribution module M6, which is a 5:1, 50 ohm power divider. Signal delay between CCD channels is accomplished by precisely varying the lengths of coaxial cables linking signal distribution module M6 with CCD interface module M1.

The various DC biases required to operate the CCD are generated on the CD Bias module M2. All biases used are developed from sources regulated on DC Bias module M2 and set by potentiometers on DC Bias module M2. The biases are brought to CCD interface module M1 via two, twisted-pair flat cables.

Charge propagation in the single, serial, output channel is provided by the output drivers M5. Adjustment of both the high and low levels of each individual driver is provided. As in M2, these levels are derived from locally regulated voltages. All drivers are driven directly from ECL logic having an output voltage level of 0.8 Volts peak to peak.

Timing among the various drivers is partitioned between fast ECL control module M3 and slow ECL control module M4. The faster circuitry (M3) operates from a fast clock (FC) at rates from DC to 500 MHz with sub-nanosecond edges. The slower circuitry (M4) operates simultaneously from one-tenth FC (DC-500 MHz) and from an asynchronous slow clock (SC), or DC to 2 MHz, all with two nanosecond edges. Logic is minimized on fast ECL module M3 because of the extra care required in handling sub-nanosecond edges and 500 MHz clocking via microstrip, wire-over-ground-plane, and coaxial transmission lines. To the greatest extent practical, control is handled by module M4, leaving only the signal sampler timing, input register timing, and triggers to external equipment on module M3. All programmable control functions reside on module M4 which employs wire-over-ground-plane and twisted pair transmission lines. Module M3 is linked to module M4 via twisted pair transmission lines.

The control timing required is indicated by the exerciser timing diagram presented as FIG. 13. Three major states are provided. During READIN, the fast clock (FC) controls signal sampling and the input registers at FC/2. This period in the illustrated embodiment 14 is 9,990 input transfers per channel. However, only the portion selected by the FAST switches (on M4) causes clocking at the CCD. Using the FAST BCD rotary switches, 0 to 9980 actual input transfers per channel are selected. When the fast transferring begins, the fast trigger (FT) is generated. During READIN, a delayed trigger (DT) is also generated in a manner analogous to that just described for FT. Setting the BCD DELAY switches causes a DT of 0 to 9980 input transfers per channel from the end of READIN. After completing READIN, the exerciser moves into HOLD state during which all circuitry is initialized and M3's input is switched from FC to SC/10, a one-tenth slow clock generated by M4. As READOUT mode commences, a slow trigger (ST) is generated. The BCD SLOW switches select 0–990 input transfers per channel at SC/20.

Three major modes of operation composed of sequences of the above states are selected either manually, via a rocker switch on M4 (not shown), or remotely, via the remote control interface. The standby mode is slow only. It is a sequence of HOLD/READOUT/HOLD-/READOUT/HOLD, etc. Repetitive mode is a sequence of HOLD/READIN/HOLD/READOUT/-HOLD/READIN, etc. Single shot calls for a single READIN, followed by a HOLD/READOUT/-HOLD/READOUT, etc. sequence. Access to these mode controls plus key synchronizing signals permits control of the exerciser from remote circuitry (e.g., computer).

As indicated, the transient recorder 10 utilizes a plurality of interleaved data channels, as illustrated in FIG. 9, which is a top semi-schematic view of a CCD 12 of the type contemplated for use with the exerciser 14. As indicated on the drawing, the CCD 12 has five substantially identical data channels defined by adjoining impurity diffused or ion implanted channel stop zone in accordance with buried channel CCD design techniques. The sampling and charge transport functions of all channels are closed simultaneously and each channel has a substantially identical signal sampler, which will be more fully described in connection with FIG. 10. All gate fingers and transport electrodes are extended directly across all channels, with the exception of the signal gates which are brought out separately. Interleaved sampling is achieved by providing delayed signal waveforms to each of the channels. The reference channel is operationally identical to each signal channel, and 1, 2, or 4 phase drive is compatible with this signal sampling system.

As shown in FIGS. 9 and 10, the CCD has input diffusions Id1–5 for the four channel samplers and the reference channel sampler, respectively, and appropriate input connections to ID1–5 thereto. The respective input signals to the five data channels, IN1–5 are applied to the respective signal gates, as illustrated. Unlike the other electrode gates, the signal gate, as illustrated only overlay their respective data channels. Appropriate connections are also provided to the isolation gate ($\phi$BG), the cutter gate ($\phi$CG), the buffer gate (BG), the four phase transport electrodes ($\phi$1-4) and the various other CCD chip structures.

As shown in more detail in FIG. 10, which is a cross sectional view of the sampler section of the first data channel of the CCD of FIG. 9. The CCD structure is seen to be of the buried channel CCD type having an input diffusion ID1 to which a dc bias voltage is applied. The sampler further has an isolation gate ISG which is also dc biased. The bias voltages are supplied to the CCD 12 by the module M2. In operation, and which serves to control and make uniform the charge transport from the input diffusion adjacent the isolation gate is a cutter gate which functions to "cut off" the amount of signal charge transported to the signal gate as a signal sample. The cutter gate is driven by the submodule SM1 dual input gate driver of the interface module M2. Accordingly, the gate next adjacent the cutter gate is the signal gate to which the continuously varying analog signal is applied. The final gate of the input structure is the buffer gate BG which is also driven by the submodule SM1 dual input gate driver of the CCD interface module M2. The buffer gate is an important aspect of the sampler and sampling methods relating thereto. Through the provisions of the buffer gate following the signal gate, rather than a conventional electrode which is a part of the transport electrode system, sampler operating parameters may be substantially improved, as will be more fully described hereinafter.

The transport electrode system follows the buffer gate, and may be a conventional form phase transport electrode system, but beginning with the phase 2 electrode, as shown. These transport electrodes are bussed to many succeeding electrodes, and function to transfer charge packets, which have been generated by the sampler, down the CCD structure.

The nominal gate size is 5 microns along the channel for all the sampler and transport gates, with the exception of the first transport gate as illustrated, which may be longer (e.g., twice as long) to improve charge flow from the buffer gate.

In operation, each electrode generates a potential in the CCD channel region which is a function of the voltage applied to the respective electrode. When the signal voltage is applied to the respective signal gate, it creates a continuously varying potential therebelow in the CCD channel. Charge is flooded from the input diffusion under the dc biased isolation gate and the cutter gate to the signal gate region of the CCD channel. The amount of charge which resides under the signal gate is determined by the signal voltage on the signal gate, so as the voltage varies on the signal gate, the amount of charge residing under the signal gate varies proportionately. Sampling is carried out by periodically cutting off the charge flow between signal gate and the source of charge by means of a negative voltage charge pulse applied to the cutter gate to pinch off the charge flow and isolate the quantity of charge under the signal gate. The isolated charge is generally proportional to the signal voltage at the time the cutter gate voltage goes negative. The isolated signal charge is transferred from the channel zone under the signal gate to the zone under the buffer gate at the clock frequency. As indicated, the provision of the buffer gate is a desirable feature of the sampler system. By providing a separate buffer gate, and by applying a separate waveform to the buffer gate, the time period during which the charge flows from the input diffusion into the CCD zone under the signal gate may be extended, and better equilibration of the signal charge may be provided thereby to produce a more accurate relation between the signal voltage and the isolated signal charge produced by the sampler.

By providing a relatively low capacitance the "extra" buffer gate, which would otherwise be a $\phi T1$ electrode of the relatively high capacitance transport electrode system, improved waveform control may be provided to the buffer gate.

In this connection, controlling the waveform in a propagation gate for a charge coupled device is difficult at operating frequencies greater than 100 MHz, and the transport waveform for drawing the transport electrode system may be of sinewave or sawtooth shape not particularly well adapted for control of signal sampling.

The advantage of the buffer gate is that the very low capacitance (which may be less than about 2 pf, e.g., about 1 pf in the illustrated embodiment 12) facilitates drive and control of a waveform which minimizes fringing and related adverse signal sampling effects between the buffer gate and the signal gate.

The charge transport electrodes of the CCD 12 present a capacitance of about 50 pf, and may be charged to about 10 volts in less than or about 2 nanoseconds, in order to provide 250 MHz operation. However, the rise time on the low capacitance buffer gate is about one nanosecond (90% peak to peak rise time) which permits a "squarer" wave above 100 MHz operation, which is beneficial to signal sampling. Further, while the duty cycle of the transport electrode waveform is substantially 50%, the duty cycle of the separate buffer gate may be extended to substantially more than 50% (e.g., 60-70% or more) to facilitate charge sample equilibration and transport. Desirably, the signal applied to the buffer gate will be substantially in phase with the $\phi I1$ transport electrode waveform from the propagation drivers at the beginning of the positive voltage duty cycle, but will have a faster rise time and fall time, and will extend longer in time, such as about 10-50% longer than the positive duty cycle time of the $\phi 1$ transport electrode waveform.

The driver submodules SM1 and SM3 for supplying the CCD sampler and transport electrode propagation signals will now be more specifically discussed in respect of the CCD interface module M1.

The CCD interface module M1, the circuit components of which are as shown in FIG. 2 and the following component list tables, interfaces all drive waveforms, signals and DC bias to and from the CCD 12. It further provides a socket which eliminates the need for permanent CCD attachment.

| EXERCISER PARTS LIST Module M1 - CCD Interface | | | | |
|---|---|---|---|---|
| Designation | Description | Value | Qty | Same Parts |
| R31 | Resistor 1% | 93.1 | 2 | R35 |
| R1 | " | 100 | 9 | R2,5,6,8-12 |
| R3 | " | 1K | 13 | R4 |
| R33 | " | 10K | 7 | R7,29,26,23,20,17, 14 |
| R34 | Resistor 5% ¼w | 100 | 6 | R38,44,30,41,47 |
| R15,18,21, 24,27 | Chip Res. 42% | 50.0 | 5 | (MSI Mfr.) |
| C5 | CAP, Ceramic | .001µf | 3 | C7,2 |
| C1 | " | .1µf | 16 | See Schematic |
| C88 | CAP, Tant 20V | 15µf | 2 | C87 |
| C10 | CAP, Chip 50V | .12µf | 15 | C8,11,18,21,27,24, |

-continued

EXERCISER PARTS LIST
Module M1 - CCD Interface

| Designation | Description | Value | Qty | Same Parts |
|---|---|---|---|---|
| | | | | 30,33,45,55,59,61, 54,49 |
| C60 | " | .001 | 22 | See Schematic |
| C52 | " | 100pf | 5 | C47 |
| | 26 Pin Header Textronic Probe Socket | Ansley | 5 | J6,7,8,5,4 |
| | Coax Connector | SMA | 5 | IN1–IN5 |
| | Spacer | ⅜" ln | 16 | |
| | Machine Screws | 4/40 × 1 1/4 | 16 | |
| | Lockwashers | #4 | 16 | |
| L1,L2 | Wire Jumper Replaces Component C69,73,77,81,85 | | | |

Module M2 - CCD - Bias

| Designation | Description | Value | Qty | Same Parts |
|---|---|---|---|---|
| R4 | Resistor 5% | 6.8 | 1 | ¼ Watt |
| R9 | " | 6.8 | 1 | " |
| R16 | " | 8.2 | 1 | " |
| R14 | " | 27 | 1 | " |
| R19 | Resistor 1% MF | 100 | 1 | " |
| R24 | " | 100 | 1 | " |
| R6 | Resistor 5% | 270 | 1 | " |
| R1 | " | 270 | 1 | " |
| R137 | " | 270 | 1 | " |
| R11 | Resistor 1% | 453 | 1 | " |
| R2 | " | 453 | 1 | " |
| R31 | " | 453 | 1 | " |
| R35 | " | 453 | 1 | " |
| R7 | " | 453 | 1 | " |
| R39 | Resistor 1% MF | 619 | 1 | " |
| R43 | " | 619 | 1 | " |
| R47 | " | 619 | 1 | " |
| R51 | " | 619 | 1 | " |
| R136 | " | 619 | 1 | " |
| R59 | Resistor 1% | 825 | 1 | " |
| R85 | " | 1K | 1 | " |
| R77 | " | 1.33K | 1 | " |
| R73 | " | 1.33K | 1 | " |
| R69 | " | 1.33K | 1 | " |
| R65 | " | 1.33K | 1 | " |
| R61 | " | 1.33K | 1 | " |
| R128 | " | 1.78K | 1 | " |
| R132 | " | 1.78K | 1 | " |
| R15 | " | 2.43K | 1 | " |
| R80 | " | 3.48K | 1 | " |
| R129 | " | 3.48K | 1 | " |
| R133 | " | 3.48K | 1 | " |
| R5 | " | 3.48K | 1 | " |
| R105 | " | 3.48K | 1 | " |
| R101 | " | 3.48K | 1 | " |
| R97 | " | 3.48K | 1 | " |
| R93 | " | 3.48K | 1 | " |
| R89 | " | 3.48K | 1 | " |
| R84 | " | 3.48K | 1 | " |
| R104 | " | 4.42K | 1 | " |
| R100 | " | 4.42K | 1 | " |
| R96 | " | 4.42K | 1 | " |
| R92 | " | 4.42K | 1 | " |
| R88 | " | 4.42K | 1 | " |
| R36 | " | 4.99K | 1 | " |
| R32 | " | 4.99K | 1 | " |
| R10 | " | 5.90K | 1 | " |
| R23 | " | 6.19K | 1 | " |
| R28 | " | 6.19K | 1 | " |
| R13 | " | 6.19K | 1 | " |
| R76 | " | 6.65K | 1 | " |
| R72 | " | 6.65K | 1 | " |
| R68 | " | 6.65K | 1 | " |
| R64 | " | 6.65K | 1 | " |
| R60 | " | 6.65K | 1 | " |
| R34 | Resistor 5% | 8.2K | 1 | " |
| R30 | " | 8.2K | 1 | " |
| R18 | Resistor 1% | 8.25K | 1 | " |
| R138 | Resistor 5% | 10K | 1 | " |
| R139 | " | 10K | 1 | " |

-continued

Module M2 - CCD - Bias

| Designation | Description | Value | Qty | Same Parts |
|---|---|---|---|---|
| R81 | Resistor 1% MF | 1.0K | 1 | " |
| R20 | " | 100K | 1 | " |
| R25 | " | 100K | 1 | " |
| R3 | POT | 100 | 1 | Cermet M-T Trim |
| R8 | " | 100 | 1 | " |
| R12 | " | 500 | 1 | " |
| R17 | " | 2K | 1 | " |
| R38 | " | 2.5K | 1 | " |
| R42 | " | 2.5K | 1 | " |
| R54 | " | 2.5K | 1 | " |
| R50 | " | 2.5K | 1 | " |
| R46 | " | 2.5K | 1 | " |
| R57 | " | 5K | 1 | " |
| R33 | " | 5K | 1 | " |
| R29 | " | 5K | 1 | " |
| R82 | " | 10K | 1 | " |
| R86 | " | 10K | 1 | " |
| R90 | " | 10K | 1 | " |
| R94 | " | 10K | 1 | " |
| R98 | " | 10K | 1 | " |
| R102 | " | 10K | 1 | " |
| R106 | " | 10K | 1 | " |
| R130 | " | 10K | 1 | " |
| R134 | " | 10K | 1 | " |
| R62 | " | 10K | 1 | " |
| R70 | " | 10K | 1 | " |
| R74 | " | 10K | 1 | " |
| R78 | " | 10K | 1 | " |
| R22,27 | " | 20K | 1ea | " |
| C19 | CAP, Ceramic | .1μf | 9 | C20,23,27,24,26,28 15,29 |
| C47 | CAP, Ceramic | .01μf | 31 | C18,21,25,22,31,33 35,37,39,41,42,43, 44,45,46,6,2,9,4, 16,12,6000,59,53, 52,51,50,49,48,3 |
| C1 | CAP, Tantalum | 4.7μf | 1 | |
| C5 | CAP, Ceramic | 330pf | 3 | C11,8 |
| C17 | CAP, Tantalum | 47μf | 9 | C13,30,7,32,36,38, 34,10 |
| D1 | Diode | IN914A | 2 | D3 |
| D5 | Diode | IN914B | 6 | D6,7,8,9,10 |
| D11 | Diode | IN4001 | 2 | D12 |
| D4 | Diode | IN5298 | 2 | D2 |
| Q1 | Transistor | 2N2219A | 2 | Q2 |
| Q3 | Transistor | 2N2905A | 2 | Q2 |
| U5 | IC | LH0042 | 2 | U6(National) |
| U3 | IC | LA5723B | 3 | U2,1(Lambda) |
| U4 | IC | LM304H | 1 | (National) |
| J9 | Connectors | 26 PIN | 3 | J10,11(Ashley) |
| R21 | Jumper Wire Replaces Component | | 28 | R26,37,41,45,49,53 56,63,67,71,75,79, 40,44,48,52,55,58, 135,131,107,103,99 95,91,87,83 |
| R111 | Res Not Used (Devices on PC Board but not used in emb. 14 | | 15 | R115,119,123,127, 108,109,112,113, 116,117,120,121, 124,125 |
| R110 | Pot not used | | 5 | Rp114,118,122,126 |
| C14 | Cap not used | | 7 | C40,54,55,56,57,58 |

Module M3 - FAST ECL

| Designation | Description | Value | Qty | Same Paarts |
|---|---|---|---|---|
| See Schematic (for multiple circuit elements) | Resistor 5% ⅛w | 51 | 27 | |
| | " | 75 | 48 | |
| | " | 100 | 6 | |
| | " | 220 | 8 | |
| | " | 470 | 9 | |
| | Holtite | | | |
| | CAP, Ceramic | 0.001 | 68 | |
| | " | 0.01 | 28 | |
| | " | 33μf | 1 | |
| | " | 100pf | 31 | |
| | " | 331pf | 1 | |
| | IC(Fairchild) | 10101 | 1 | |
| | | 10116 | 2 | |
| | | 11C70 | 11 | |
| | | 95101 | 1 | |
| | | 100102 | 2 | |
| | Specials, Functionally like 11C01, but faster | U-#3 | 1 | |
| | | J-#4 | 1 | |
| | | I-#5 | 1 | |
| | | S-#6 | 1 | |
| | BNC, CONN | 74868 | 6 | |
| | Connector | Ansley | 2 | |
| | Press-Fit | Selectro | 9 | |
| WC1 | Coax Jumper | 12.93in | | UNI-T 95 ohm coax |

-continued

Module M3 - FAST ECL

| Designation | Description | Value | Qty | Same Paarts |
|---|---|---|---|---|
| WC2 | Coax Jumper | 11.28in | " | |
| WC3 | Coax Jumper | 7.93in | " | |
| WC4 | Wire Jumper | .2in | | #24 ga. wire over groundplane |
| WC5 | Microstrip, Part of Printed Circuit Board | | | |
| WC6 | Coax Jumper | 8.0in | | UNI-T 75 ohm coax |
| WC7 | Wire Jumper | .3 in | | #24 ga. wire over groundplane |
| WC8 | Coax Jumper | 1.90in | | UNI-T 75 ohm coax |

Module M4 - COMPONENT

| Designation | Description | Value | Qty | Same Parts |
|---|---|---|---|---|
| See Schematic (for Multiple circuit elements) | Res Netwk 8 Pin SIP | 100 | 26 | |
| | Res 6 Pin SIP | 100 | 2 | |
| | | 470 | 6 | |
| | Resistor 5% ⅛w | 220 | 1 | |
| | Diode | 914 | 6 | |
| | IC | F95010 | 10 | |
| | IC | F95016 | 1 | |

Module M4 - COMPONENT

| Designation | Description | Value | Qty | Same Parts |
|---|---|---|---|---|
| | IC | F95101 | 2 | |
| | IC | F95105 | 12 | |
| | IC | F95107 | 3 | |
| | IC | F95110 | 1 | |
| | IC | F95111 | 1 | |
| | IC | F95116 | 2 | |
| | IC | F95130 | 2 | |
| | IC | F95231 | 6 | |
| | | 230002 | 8 | |
| SM13-Debounce | | 10K,4.7K resistors, 1 f CAP, 1 ea | 1 | |
| Aux Switch | | | | |
| Cap, Bypassing | | 33µf, 10V | 2 | |
| | | 0.1µf, AW CER | 8 | |
| | | 0.01µf, cer | 20 | |
| SC input BNC + | | 51 5% ⅛w | | |
| | | 220 5% ⅛w | | |
| SM12-SC interface | | 100 5% ⅛w | | |
| | | 470 5% ⅛w | | |
| | | 0.01 f | | |

Module M5 - Output-Drivers

| Designation | Description | Value | Qty | Same Parts |
|---|---|---|---|---|
| R3-AB(R1-AB) | Resistor 5% ¼w | 43 | 4 | SM9 |
| R2-AB | " | 12 | 2 | SM9 |
| R1 | Resistor 1% ¼w | 274 | 1 | SM11 |
| C1 | CAP 104M | 0.1µf | 1 | SM11 |
| D1,2 | Diode | IN914 | 2 | SM11 |
| R1-6 | Resistor 1% | 2.87K | 6 | Dr. Cur. Limiter |
| R1 | Res | 1.4K | 6 | |
| R 1 | Pot, Cermet | 2K | 6 | |
| R 2 | Pot, Cermet | 10K | 6 | |
| R 3 | " | 25K | 6 | |
| R 4 | " | 200 | 6 | |
| R 5 | " | 250 | 6 | |
| C1,2 | Cap, Ceramic | .01µf | 6 | |
| | IC, Dual, Line Receiver | LM319D | 3 | National I.C. |
| R1 | Resistor 1% | 243 | 1 | SM+23 Regula |
| R2 | Pot ½W | 500 | 1 | SM+23 Regula |
| R3 | Pot 1% | 3.92K | 1 | SM+23 Regula |
| C1 | Cap(CN20C104M) | .01µf | 1 | SM+23 Regula |
| C2 | Cap, Tant | 1µf | 1 | SM+23 Regula |
| U1 | I.C. National | LM317T | 1 | SM+23 Regula |
| | Heat Sink | | 1 | SM+23 Regula |
| R3 | Resistor 5% ⅛w | 2.2K | 1 | SM7:−12V Reg |
| C1 | Cap (Tant) | 2.2µf | 1 | " |
| C4 | Cap (Tant) | 1 µf | 1 | " |
| U1 | LM320T-12 | −12V | 1 | National I.C. |
| | Heat Sink | | 1 | 6054B,Thermalloy |
| R1 | Pot ½w | 200 | 1 | SM8:−16V Reg |
| R2 | Resistor 1% ½w | 1K | 1 | " |
| R3 | Resistor 5% ⅛w | 3.3K | 1 | " |
| C1 | Cap (Tant) | 2.2µf | 1 | " |
| C2 | Cap (CW20C104M) | .1µf | 1 | " |
| C3 | Cap (Tant)Sprague | 15µf | 1 | " |
| C4 | Cap (Tant)Sprague | 1µf | 1 | " |
| U1 | LM320-T-15 | −17.5V | 1 | |
| | Heat Sink | | 1 | Thermalloy-6045B |
| R1 | Resistor 1% ¼w | 243 | 1 | SM:17.5V Reg |
| R2 | Pot, ½w | .500 | 1 | " |
| R3 | Resistor 1% ¼w | 2.87K | 1 | " |
| R4 | Resistor 5% ⅛w | 3.3K | 1 | " |
| C1 | Cap (CW20104M) | .1µf | 1 | " |
| C2 | Cap (Tant) | 1µf | 1 | " |
| U1 | LM317T(I.C. | 17.5V | 1 | National Reg |
| | Heat Sink | | 1 | Thermalloy-6045B |

Module M6 - Signal Distr

| Designation | Description | Value | Qty | Same Parts |
|---|---|---|---|---|
| S1,S1-5 | SMA Coax Conn. | 6 | Selectro | |
| R4-8 | | 5 | MSI | 33 ohm chip res. |
| R1-3 | | 3 | MSI | 100 ohm chip res. |

Module M7 - Power Distr

| Designation | Description | Value | Qty | Same Parts |
|---|---|---|---|---|
| A1-7 | 26 Pin Header Con | | | Ansley Part 609-2652M |
| D1-7 | 26 Pin Header Con | | | Ansley Part 609-2652M |

Module SM1 - Input-Driver

| Designation | Description | Value | Qty | Same Parts |
|---|---|---|---|---|
| R1 | Resistor 5% ⅛w | 51 | 1 | SM1-Q705B |
| R2 | " | 51 | 1 | |
| R3 | " | 75 | 1 | |
| R4 | " | 51 | 1 | |
| R5 | " | 51 | 1 | |
| R6 | " | 51 | 1 | |
| R7 | " | 75 | 1 | |
| R8 | " | 51 | 1 | |
| R9 | " | 51 | 1 | |
| R10 | " | 51 | 1 | |
| R11 | " | 75 | 1 | |
| R12 | " | 51 | 1 | |
| R13 | " | 51 | 1 | |
| R14 | " | 51 | 1 | |
| R15 | " | 51 | 1 | |
| R16 | " | 51 | 1 | |
| R17 | " | 51 | 1 | |
| R18 | " | 51 | 1 | |
| R19 | " | 33 | 1 | |
| R20 | " | 33 | 1 | |
| R21 | Resistor 5% ¼w | 18 | 1 | |
| R22 | " | 22 | 1 | |
| R23 | " | 22 | 1 | |
| R24 | " | 200 | 1 | |
| R25 | " | 330 | 1 | |
| R26 | " | 51 | 1 | |
| R27 | Resistor 5% ⅛w | 51 | 1 | |
| R28 | " | 33 | 1 | |
| R29 | " | 33 | 1 | |
| R30 | Resistor 5% ¼w | 18 | 1 | |
| R31 | " | 22 | 1 | |
| R32 | " | 22 | 1 | |
| R33 | Resistor 5% ⅛w | 22 | 1 | |
| R34 | " | 1K | 1 | |
| R35 | " | 1K | 1 | |
| R36 | Pot | 1K | 1 | |
| R37 | Pot | 1K | 1 | |
| R38 | Pot | 1K | 1 | |
| R39 | Pot | 1K | 1 | |
| R40 | Resistor 5% | 3.3K | 1 | |
| R41 | Resistor 5% ⅛w | 1K | 1 | |
| R42 | " | 1K | 1 | |
| R43 | Pot | 1K | 1 | |

Module SM1 - Input-Driver -continued

| Designation | Description | Value | Qty | Same Parts |
|---|---|---|---|---|
| R44 | " | 1K | 1 | |
| R45 | " | 1K | 1 | |
| R46 | " | 1K | 1 | |
| R47 | Resistor 5% | 3.3K | 1 | |
| R48 | " | 3.3K | 1 | |
| C1 | Cap | 1.5-4pf | 1 | |
| C2 | Cap | " | 1 | |
| C3 | Cap | " | 1 | |
| C4 | Cap, Chip | .12μf | 1 | |
| C5 | Cap | .01μf | 1 | |
| C6 | Cap | .01μf | 1 | |
| C7 | Cap | .01μf | 1 | |
| C8 | Cap. | .01μf | 1 | |
| C9 | Cap | .01μf | 1 | |
| C10 | " | " | 1 | |
| C11 | " | " | 1 | |
| C12 | " | " | 1 | |
| C13 | Cap Open | 0 | 0 | |
| C14 | Cap Open | 0 | 0 | |
| C15 | Cap, Chip | .12μf | 1 | |
| C16 | " | 1000pf | 1 | |
| C17 | " | 12μf | 1 | |
| C18 | " | 1000pf | 1 | |
| C19 | " | 1000pf | 1 | |
| C20 | " | .12μf | 1 | |
| C21 | " | .12μf | 1 | |
| C22 | " | .12μf | 1 | |
| C23 | " | 1000pf | 1 | |
| C24 | " | 0 | 0 | |
| C25 | " | 0 | 0 | |
| C26 | " | 1000pf | 1 | |
| C27 | " | .12μf | 1 | |
| C28 | Cap, Tantalum | 33μf | 1 | |
| C29 | Cap, Chip | 1000pf | 1 | |
| C30 | " | .12μf | 1 | |
| C31 | " | 1000pf | 1 | |
| C32 | " | 1000pf | 1 | |
| C33 | Cap, Tantalum | 33μf | 1 | |
| C34 | cap, Chip | 1000pf | 1 | |
| C35 | " | .12μf | 1 | |
| C36 | " | 1000pf | 1 | |
| Q1 | Transistor | BFR96 | 1 | |
| Q2 | " | " | 1 | |
| Q3 | " | " | 1 | |
| Q4 | " | " | 1 | |
| Q5 | " | " | 1 | |
| Q6 | " | " | 1 | |
| IC1 | 100114 | — | 1 | |
| IC2 | 100114 | — | 1 | |
| | BG Input Con | SMA | 1 | |
| | CG Input Con | SMA | 1 | |

Module SM3 - Dual Transport

| Designation | Description | Value | Qty | Same Parts |
|---|---|---|---|---|
| R1 | Resistor 1% | 49.9 | 1 | Gate Driver A-B |
| R2 | " | " | 1 | " |
| R3 | " | " | 1 | " |
| R4 | Resistor 5% | 75 ⅛w | 1 | " |
| R5 | " | " | 1 | " |
| R6 | Resistor 1% | 49.9 | 1 | " |
| R7 | " | 75 ⅛w | 1 | " |
| R8 | Resistor 5% | 75 ⅛w | 1 | " |
| R9 | " | 2.7 ⅛w | 2 | " |
| R10A | " | 2.7 ⅛w | 2 | " |
| R11A | Resistor 1% | 33.2 | 2 | " |
| R12A | " | 33.2 | 2 | " |
| R13A | " | 60.4 | 2 | " |
| R14A | " | 60.4 | 2 | " |
| R15A | " | 33.2 | 2 | " |
| R16A | Resistor 5% | 6.8 | 2 | " |
| R17A | Resistor 1% | 33.2 | 2 | " |
| R18A | Resistor 5% | 10 | 2 | " |
| R19 | Pot | 1K | 1 | " |
| R20 | Resistor 5% | 1K | 1 | " |
| C27A | CAP-14F1271 | 12pf | 2 | " |
| C28A | CAP-9410-25 | 5-25 | 2 | " |

-continued

Module SM3 -Dual Transport

| Designation | Description | Value | Qty | Same Parts |
|---|---|---|---|---|
| C29A | CAP-9410-25 | 1000pf | 2 | " |
| C1 | CAP-GKU4R000 | 1.5–4pf | 2 | " |
| C2 | " | " | 2 | " |
| C3 | " | " | 2 | " |
| C4 | " | 1000pf | 2 | " |
| C5 | " | .12μf | 2 | " |
| C6 | " | 1000pf | 2 | " |
| C7 | " | .12μf | 2 | " |
| C8A | " | 1000pf | 2 | " |
| C9A | " | .12μf | 2 | " |
| C10A | " | 1000pf | 2 | " |
| C11 | " | .12μf | 2 | " |
| C12A | " | 1000pf | 2 | " |
| C13A | " | .12μf | 2 | " |
| C14 | Not usef | Open | 0 | " |
| C15 | CAP-GKUR000 | 1000pf | 1 | " |
| C16 | " | .12μf | 1 | " |
| C17 | " | 33μf | 1 | " |
| C18 | " | 1000pf | 2 | " |
| C19A | " | .12μf | 2 | " |
| C20A | " | 15μf | 2 | " |
| C21A | " | .12μf | 2 | " |
| C22A | " | 1000pf | 2 | " |
| C23 | " | " | 2 | " |
| C24 | " | .12μf | 2 | " |
| C25 | None | Open | 0 | " |
| C26 | None | Open | 0 | " |
| L1A | COIL-57-0181 | " | 2 | " |
| L2A | " | #22 wire | 2 | " |
| L3A | " | .051 | 2 | " |
| L4A | " | #22 wire | 2 | " |
| L5A | " | #.1 | 2 | " |
| L6 | " | 20/4B | 1 | " |
| L7A | COIL-57-3425 | Fer Bead | 2 | Mfg Stackpole |
| L8A | COIL-57-0180 | " | 2 | " |
| D1A | " | IN914B | 2 | " |
| D2A | COIL-5082-2810 | 2810 | 2 | H.P. |
| D3A | COIL-5082-2810 | 2810 | 2 | H.P. |
| D4A | COIL-5082-2810 | 2810 | 2 | H.P. |
| Q1A | Transistor | BFR96 | 2 | |
| Q2A | " | BFR96 | 2 | |
| Q3A | " | MM8009 | 2 | |
| Q4A | " | MRF227 | 2 | |
| IC | F100114FC(24 Pin) | F10014FC1 | | Fairchild |

Module M4 - Output-Amplifier

| Designation | Description | Value | Qty | Same Parts |
|---|---|---|---|---|
| R5 | Resistor 5% ¼w | 680 | 1 | SM4-Output-Amp |
| R4 | Resistor 1% ¼w | 10K | 1 | " |
| C1 | Cap(CW15C102M) | 0.01μf | 1 | " |
| C4 | Cap(CW15C102M) | 0.01μf | 2 | " |
| C2 | Cap SPRAGUE | 4.7K | 2 | " |
| C3 | Cap SPRAGUE | 4.7K | 2 | " |
| D1 | IN914B | — | 2 | " |
| D2 | IN5286 | — | 2 | " |
| D3 | IN5310 | — | 2 | " |
| Q1 | 2N2905A | — | 2 | " |
| | BNC-Conn | — | 2 | " |
| | Textronic Probe Socket | — | 2 | " |
| | Wire Jumper | — | 2 | " |

As further shown in FIG. 1, the input signal SI to be sampled is applied to signal distribution modules M6, schematic component details of which are shown in FIG. 7.

The module M6 is a matched resistive 5 port splitter which may be used to provide input signals S1, S2, S3, S4, S5 to each of the five channels of the CCD 12. Alternatively, a dc reference voltage may be applied to a reference channel of the CCD, and a plurality of four (or less) input signals from module M6 may be provided to respective CCD data channels. Because the CCD samples each inputs signal substantially simultaneously, differential time delay for the various signals S1, S2, S3, S4, S5 is provided by appropriate variation of the coaxial cables conducting the signals 1–5 from module M6 to module M1. In this regard, for example, at a sampling rate of 250 MHz for reference channel and from data channel sampling, 8 inch increments of coaxial cable length (with the S3 cable being 8" longer than the S2 cable, S4 being 8" longer than S3, and S5 8" longer than S4) produce a 1 nanosecond delay between signals S2–S5 to provide for a GHz sampling the input signal by the CCD 12. The coaxial cable incremental length may be varied for different sampling speeds and configurations.

The parallel sample architecture of the CCD in turn is driven by the dual input gate driver submodule SM1 of the CCD interface module M1.

As shown in more detail in FIG. 11, the submodule SM1 of module M1 generates two output waveforms to drive the cutter gates and the buffer gate of the CCD 12. The input to submodule SM1 is a single ECL clock signal Lφ1 from module M3, which is directed to two generally similar drivers (operating at different phase) for the cutter and buffer gates, respectively. These two drivers, together with a string of ECL comparators with variable RC circuits coupling them, and various voltage dividers for biasing inputs to these comparators, to provide means for controlling and varying duty cycle of the output signals, and to vary the delay of the respective waveforms to provide for adjustment in respective time delay from input to the respective output signals $\phi CG$ (cutter gate) and $\phi BG$ (buffer gate).

While the relatively low capacitance cutter gate and buffer gate structure of the CCD is driven by submodule SM1, the relatively high capacitance four phase transport electrodes of the CCD are driven by two submodules SM3 of of module M1, as shown in FIGS. 1 and 12, which are appropriately driven by fast ECL signal $L\phi I1$ and $L\phi I2$, which bear a phase relationship to produce four phase output signals.

The basic design of transport driver submodule SM3 comprise an ECL element driving discrete circuitry comprising a differential amplifier stage Q1A and Q2A, which are driven differentially from final ECL comparator output. In this differential amplifier stage, the collector from each of the two differential transistors then drives the output stage, which is a totem pole output configuration comprising elements Q3A and Q4A, where Q4A is a ground emitter stage and Q3A is an emitter follower or grounded collector stage, each of which is driven by a different collector from the differential pair Q1A, Q2A. The driver uses conventional silicon devices and has very low power dissipation (it only dissipates about 2 watts when operating at low frequency). The drivers are adapted to provide wide range operation, and to permit the stopping of charge transport by abruptly stopping the output waveform. Thus, the CCD dual gate driver submodule SM1 and the transport driver submodules SM3 may be clocked for a limited number, such as 100 or 1000 cycles at high frequency (e.g., 150 MHz or more) and may then be stopped to hold the sampled signal information in the CCD to be shifted out at a relatively very slow rate. In order to stop the transfer of data at high frequency, it is important that the drivers SM3 stop abruptly, within one cycle, and such performance of a submodule SM3 driver is illustrated in FIG. 14, where it is noted that stopping the driver (by stopping the ECL input signals) is accomplished in one cycle at the peak output without the output waveform being reduced by more than 20% of the peak to peak voltage.

The transport driver interface between the CCD 12 and the driver submodules SM3 is also important, and in this regard, two modules SM3 are disposed at opposite sides of the CCD 12 and are each connected thereto via two coaxial conductors (one for each output phase) which should desirably be about an inch or less in length. However, simple direct connection of the driver to the CCD because of an admittance multiplier effect produces an undesirable impedance transformation, particularly at high frequency.

In order to alleviate this coupling problem, a resistively compensated coupling circuit is provided as shown in FIG. 15.

Ideally, a characteristically terminated transmission line is preferred, because it would provide maximum freqency bandwidth with minimum waveform distortion, regardless of its length. The high transport gate capacitance of the CCD, however, renders this approach quite difficult. A resistive line termination of value Zo shunting the CCD gate capacitance does reduce the reflection coefficients, especially at lower frequencies, but it also puts an undesirable constraint on the driver. Such a resistive termination would require significant additional output power from the drivers, even at low frequencies. The extensive driver heatsinking and system heating resulting would be very undesirable. Furthermore, the resistive termination would be overwhelmed by the low gate reactance and provide little benefit at the higher frequencies. For these reasons, the non-resistive terminated line approach is preferred.

A short segment of (coupling) transmission line terminated with a pure capacitance representative of the CCD electrode capacitance results in a capacitive input impedance of lower value than the termination itself. The input impedance of the line Zi may be represented by:

$$Zi = -j \frac{Xc - Zo \tan BL}{L + \frac{Xc}{Zo} \tan BL} \qquad (1)$$

where
Xc is the capacitive reactance of the termination.
Zo is the line characteristic impedance.
B is the line phase constant.
L is the line length.
Given Xc, Zo and B, it can be seen that Zi is maximized when BL is minimized. This corresponds to minimum input admittance, the desired condition. The degree of impedance transformation provided by the line can be measured in terms of the admittance multiplier which is defined as Yi/Yc which equals $Xc/|Zi|$.

The optimum value of Zo can be determined by partial differentiation of Equation 1 with respect to Zo. Setting this expression equal to zero and solving for Zo yields the following:

$$Zo = Xc [\tan BL + \sqrt{1 + \tan BL}\,] \qquad (2)$$

This value of Zo minimizes the admittance multiplier, given Xc, B, and L and may be defined as Zo'.

The added series source resistance Ro as shown in FIG. 15 acts to flatten the amplitude response of the transfer function significantly, as shown in FIG. 16. In addition, the driver load impedance is increased significantly at the higher frequencies. Desirably, the coaxial cable connecting the driver output to the CCD lead will be less than 1.5 inches in length, and in the illustrated embodiment 10 is 1.0 inch in length. Further, the impedance value Zo of the coaxial cable may desirably be in a range of from about 0.5 to about 2.0 times the optimum impedance value Zo' given by equation 2 hereinabove. Similarly, the series coupling resistance R in the coupling circuit as shown in FIG. 15, which represents the sum of driver output resistance and the series added resistor Ro, should have a numerical value in ohms, in the range of from about 0.5 Zo' to about 2.0 Zo'.

As indicated, the fast ECL module M3 drives the driver submodules SM1 and SM3, and is described in detail in FIG. 4. The module M3 further has a fast clock (FC) input (DC to 500 MHz) and slow trigger (ST), fast trigger (FT) and delayed trigger (DT) outputs, as well as signal connection to slow ECL module M4.

The slow ECL logic module M4, as shown in FIG. 5, is intimately associated with the fast ECL module M3 and provides the various counters and programming for the exerciser 14. By means of rotary switches on module M4, the number of fast sampling cycles before switching to slow cooking, and the number of slow cycles may be selected. Module M4 also includes a counter for a programmable delay trigger output, which may be used for triggering an external generator with predetermined delay.

The CCD transport electrode driver for the serial slow output of the "parallel" fast-sampled data stored in the CCD channels is contained in the output driver module M5. Module M5 is a low frequency clock driver which drives the multiplexing register (the short register in the CCD that multiplexes the 5 channel outputs). It is a low frequency board of relatively conventional design. It generates five phase output $\phi 01$–$\phi 04$ and $\phi RG$ for the CCD data channels 1–5 as well as $\phi PS$.

The serially clocked CCD output is directed to output amplifier submodule SM4 of CCD interface module M1, to provide output signal SO. The output amplifier submodule SM4 comprises a source follower amplifier stage combined with a transistor stage in a follower configuration. The field effect transistor is on the CCD itself, and the bipolar transistor is on the SM4 module.

Figure 3:
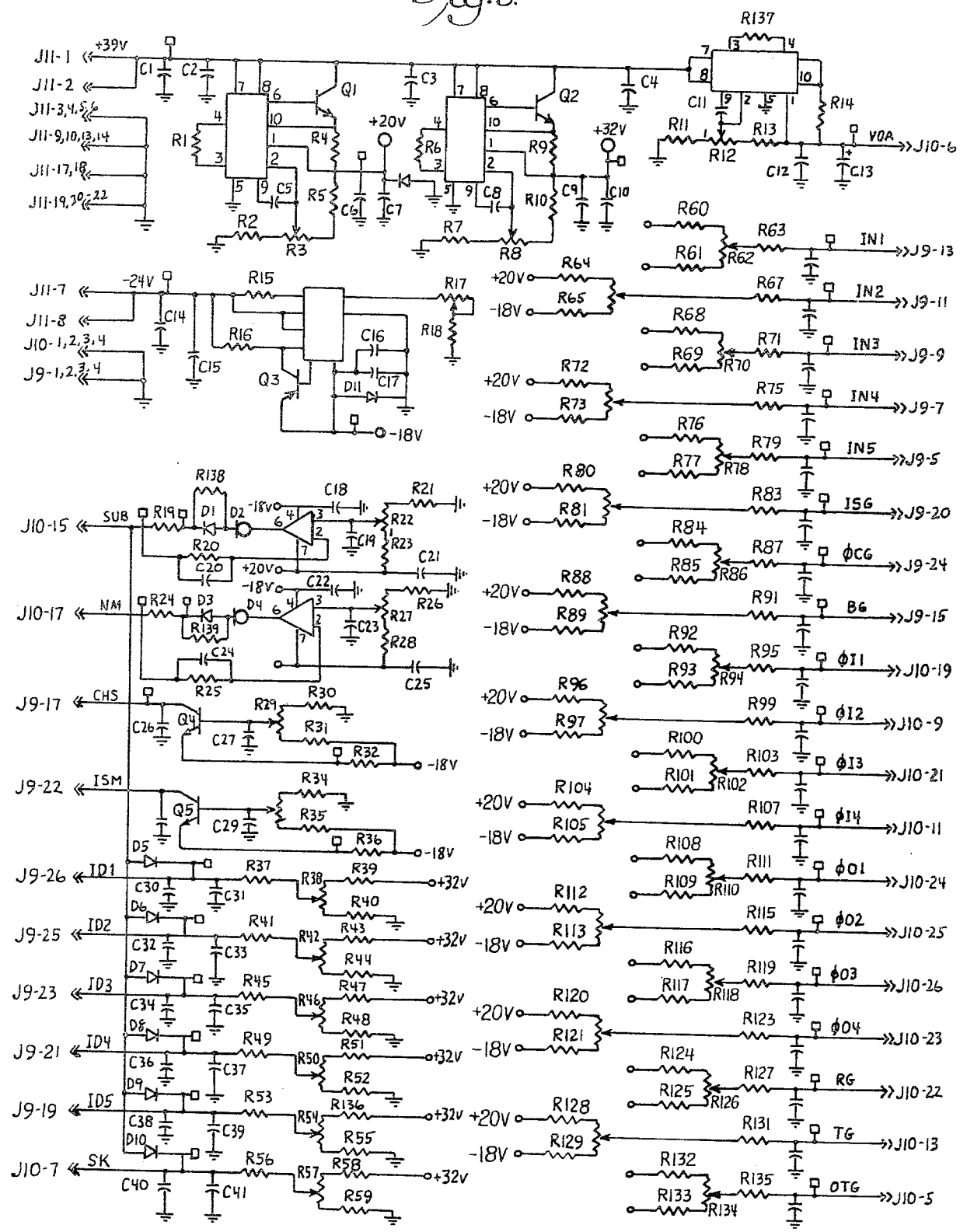
FIG. 3 is a circuit schematic of the M2-DC Bias circuit of the recorder of FIG. 1.

All of the bias voltages and currents necessary to operate the CCD 12 and exerciser 14 are provided by the module M2. As shown in more detail in FIG. 3, the module M2 itself is of relatively conventional analog circuit design.

Accordingly, it will be appreciated that the present disclosure has provided improved transient data recorder system for driving such systems.

While the present invention has been described with regard to a particular embodiment, it will further be appreciated that various modifications, adaptations and variations may be made based on the present disclosure and are intended to be within the spirit and scope of the present invention.

Various of the features of the invention are set forth in the following claims.

What is claimed is:

1. In apparatus of the CCD type for sampling an analog signal to provide charge samples representative of analog signal voltage, comprising
   means for defining a semiconductive charge transfer channel in monocrystalline semiconductive body,
   input diffusion means for inputing charge to said channel,
   a signal gate electrode overlying said channel for receiving the analog signal to be sampled,
   a cutter gate electrode overlying said channel and positioned between said signal gate electrode and said input diffusion means for periodically isolating signal charge in the transfer channel beneath said signal gate electrode,
   a plurality of bussed multiphase transfer electrodes overlying said transfer channel for transferring discrete charge samples along said channel, and
   means for outputting said charge samples, the improvement comprising
   a buffer gate electrode overlying said transfer channel and positioned between said signal gate electrode and said bussed multiphase transport electrodes, said buffer gate having effective capacitance to said semiconductive body of less than about 5 percent of the effective capacitance to said semiconductor body of each of said bussed multiphase transfer electrodes.

2. A CCD analog signal sampling system comprising resistive signal splitting means for dividing an analog input signal into a plurality of equal signals, a plurality of coaxial cables of different length electrically connected to said signal splitting means for receiving said equal signals and for providing each of said equal signals with a predetermined, different time delay, and a charge coupled device having a plurality of simultaneously sampled data channels electrically connected to respective ones of said plurality of coaxial cables.

* * * * *